US012615990B2

(12) United States Patent

Ip

(10) Patent No.: US 12,615,990 B2
(45) Date of Patent: Apr. 28, 2026

(54) INTEGRATED METROLOGY FOR PROCESS CONTROLS IN WAFER BONDING SYSTEM

(71) Applicant: Tokyo Electron Limited, Tokyo (JP)

(72) Inventor: Nathan Ip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 354 days.

(21) Appl. No.: 18/355,038

(22) Filed: Jul. 19, 2023

(65) Prior Publication Data

US 2025/0029847 A1     Jan. 23, 2025

(51) Int. Cl.
*H01L 21/67*       (2006.01)
*G05B 19/4099*       (2006.01)

(52) U.S. Cl.
CPC .... *H01L 21/67092* (2013.01); *G05B 19/4099* (2013.01); *H01L 21/67288* (2013.01); *G05B 2219/45031* (2013.01)

(58) Field of Classification Search
CPC ...... G05B 19/4099; G05B 2219/45031; H01L 21/67092; H01L 21/67288
See application file for complete search history.

(56) References Cited

U.S. PATENT DOCUMENTS

| | | | |
|---|---|---|---|
| 11,335,607 B2 | 5/2022 | Ip | |
| 11,594,431 B2 | 2/2023 | Ip | |
| 11,782,411 B2 | 10/2023 | Zach et al. | |
| 2018/0173839 A1* | 6/2018 | Fang | G03F 7/70616 |
| 2021/0025695 A1* | 1/2021 | Li | G06N 3/04 |

| | | |
|---|---|---|
| 2022/0013416 A1 | 1/2022 | Ip |
| 2022/0367215 A1 | 11/2022 | Chang et al. |
| 2023/0030116 A1 | 2/2023 | Zach et al. |
| 2024/0053721 A1 | 2/2024 | Zach et al. |

FOREIGN PATENT DOCUMENTS

WO     WO 2023/009350 A1     2/2023

OTHER PUBLICATIONS

International Search Report and Written Opinion issued Aug. 30, 2024, in PCT Application No. PCT/US2024/029508, 10 pages.
Kevin T. Turner, et al., "Models to relate wafer geometry measurements to in-plane distortion of wafers", Journal of Micro/Nanolithography, MEMS, and MOEMS, vol. 15, Issue 2, 021404, Mar. 31, 2016, 2 pages (Abstract only).

* cited by examiner

*Primary Examiner* — Christopher W Carter
(74) *Attorney, Agent, or Firm* — Oblon, McClelland, Maier & Neustadt, L.L.P.

(57)       ABSTRACT

Aspects of the present disclosure provide a wafer bonding system, which, for example, can include a wafer bonding tool configured to bond a first wafer and a second wafer to each other in accordance with a first wafer bonding recipe to produce a first post-bond wafer, a metrology tool integrated with the wafer bonding tool, and a tool controller coupled to the wafer bonding tool and the metrology tool. The metrology tool can be configured to measure a physical parameter of the first wafer. The physical parameter of the first wafer representing information relates to topographical features of the first wafer. The tool controller can have a model of a wafer bonding process. The model can include an input indicative of the physical parameter of the first wafer and configured to generate the first wafer bonding recipe based, at least in part, on the physical parameter of the first wafer.

20 Claims, 16 Drawing Sheets

600A

600B

1000

1200

1300

INTEGRATED METROLOGY FOR PROCESS CONTROLS IN WAFER BONDING SYSTEM

FIELD OF THE PRESENT DISCLOSURE

The present disclosure relates generally to substrate processing, and, in particular, to a wafer bonding system that bonds wafers.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Wafer to wafer bonding is a packaging technology used in the production of microelectromechanical systems (MEMS), nanoelectromechanical systems (NEMS), microelectronics, optoelectronics, etc. Hybrid bonding, where multiple materials are in contact (there are special cases where only a single material etc. is used, which is referred to as direct bonding or fusion bonding), is a wafer-to-wafer bonding process that does not require any additional intermediate layers. In fusion bonding, two wafers (e.g., a top wafer and a bottom wafer) are brought together and the two wafers begin to bond as the interfacial surfaces of the wafers begin to touch, forming a post-bond wafer. Annealing the post-bond wafer at elevated temperatures increases the bond strength between the two wafers and forms a fusion bonded wafer.

FIG. 1A illustrates a portion of a wafer-to wafer bonding process 100 that uses a hybrid bonding process to bond two wafers using. In hybrid bonding, a top wafer 110 and a bottom wafer 120 are bonded to form a post-bond wafer 130. Hybrid bonding also includes annealing the post-bond wafer 130 to strengthen the bond strength between the two wafers 110 and 120, which is not shown in FIG. 1A.

The quality of a wafer-to-wafer bond may be dependent upon a variety of factors that may be grouped into two distinct categories: wafer characteristics and process conditions. Examples of wafer characteristics include wafer flatness, wafer smoothness, wafer cleanliness, wafer materials, and so on, while examples of process conditions include bonding temperature, environmental conditions in a bonding chamber where the wafer-to-wafer bonding process is performed, applied force, and so on.

FIG. 1B illustrates a side-view of the post-bond wafer 130. As shown in FIG. 1B, the top wafer 110 and the bottom wafer 120 are well-bonded together and there is a smooth interface 140 between the two wafers 110 and 120. FIG. 1C illustrates a side view of another post-bond wafer 130' highlighting a poor bond between two wafers. As shown in FIG. 1C, a top wafer 110' has a concave profile, which leads to the formation of a gap 140' when the top wafer 110' is bonded to a bottom wafer 120'.

SUMMARY

Aspects of the present disclosure provide a wafer bonding system. For example, the wafer bonding system can include a wafer bonding tool configured to bond a first wafer and a second wafer to each other in accordance with a first wafer bonding recipe to produce a first post-bond wafer. The wafer bonding system can also include a metrology tool integrated with the wafer bonding tool. The metrology tool can be configured to measure a physical parameter of the first wafer. The physical parameter of the first wafer representing information can relate to topographical features of the first wafer. The wafer bonding system can also include a tool controller coupled to the wafer bonding tool and the metrology tool. The tool controller can have a model of a wafer bonding process. The model can include an input indicative of the physical parameter of the first wafer and be configured to generate the first wafer bonding recipe based, at least in part, on the physical parameter of the first wafer.

In an embodiment, the tool controller can be configured to derive the model of the wafer bonding process by: having the metrology tool to measure a physical parameter of a third wafer and a physical parameter of a fourth wafer; simulating wafer bonding of the third wafer and the fourth wafer in accordance with process conditions to estimate a physical parameter of a simulated post-bond wafer; and creating the model of the wafer bonding process in accordance with the physical parameter of the third wafer, the physical parameter of the fourth wafer, the process conditions, and the estimated physical parameter of the simulated post-bond wafer. In another embodiment, the tool controller can be configured to create the model of the wafer bonding process by: comparing the physical parameter of the third wafer, the physical parameter of the fourth wafer, the process conditions, and the estimated physical parameter of the simulated post-bond wafer; and determining the model of the wafer bonding process in accordance with the comparison. In some embodiments, the tool controller can generate the first wafer bonding recipe by: estimating, by the model, post-bond distortions of the first post-bond wafer in accordance with the physical parameter of the first wafer; tuning process conditions of the first wafer bonding recipe to optimize the estimated post-bond distortions of the first post-bond wafer; and generating the first wafer bonding recipe in accordance with the tuned process conditions.

In an embodiment, the metrology tool can be further configured to measure a physical parameter of the second wafer, the physical parameter of the second wafer representing information relating to topographical features of the second wafer, and the model can generate the first wafer bonding recipe further based on the physical parameter of the second wafer.

In an embodiment, the wafer bonding tool can be further configured to bond a third wafer and a fourth wafer to each other in accordance with the first wafer bonding recipe to produce a second post-bond wafer. For example, the first wafer and the third wafer can be part of a first wafer lot, the second wafer and the fourth wafer can be part of a second wafer lot, and the first wafer lot and the second wafer lot can be processed together in a semiconductor fabrication process flow.

In an embodiment, the metrology tool can be further configured to measure a physical parameter of the first post-bond wafer, the physical parameter of the first post-bond wafer represents information relating to topographical features of the first post-bond wafer, the model can further include an input indicative of the physical parameter of the first post-bond wafer and be configured to output a second wafer bonding recipe based on the physical parameter of the first post-bond wafer, and the wafer bonding tool can be further configured to bond a third wafer and a fourth wafer to each other in accordance with the second wafer bonding recipe to produce a second post-bond wafer. For example, the metrology tool can be further configured to measure a physical parameter of the third wafer, the physical parameter of the third wafer represents information relating to topographical features of the third wafer, and the model can further include an input indicative of the physical parameter of the third wafer and be configured to output the second wafer bonding recipe further based on the physical parameter of the third wafer.

In an embodiment, the wafer bonding system can further include an enclosure, and the wafer bonding tool, the metrology tool and the tool controller can be located within the enclosure.

In an embodiment, the physical parameter of the first wafer can include at least one of a shape, overlay, in-plane distortion, slope, curvature, force and stress of the first wafer. In another embodiment, the metrology tool can include a dual Fizeau wafer interferometer, a Shack-Hartmann sensor, a PhotoStress analysis system, a wavefront phase sensor, a multi-beam reflectometry, a scanning interferometric sensor, or capacitance sensors.

Aspects of the present disclosure further provide a wafer bonding system. For example, the wafer bonding system can include a wafer bonding tool configured to bond a first wafer and a second wafer to each other in accordance with a first wafer bonding recipe to produce a first post-bond wafer, and to bond a third wafer and a fourth wafer to each other in accordance with a second wafer bonding recipe to produce a second post-bond wafer. The wafer bonding system can also include a metrology tool integrated with the wafer bonding tool. The metrology tool can be configured to measure a physical parameter of the first post-bond wafer. The physical parameter of the first post-bond wafer can represent information relating to topographical features of the first post-bond wafer. The wafer bonding system can also include a tool controller coupled to the wafer bonding tool and the metrology tool. The tool controller can have a model of a wafer bonding process. The model can include an input indicative of the physical parameter of the first post-bond wafer and be configured to generate the second wafer bonding recipe based, at least in part, on the physical parameter of the first post-bond wafer.

In an embodiment, the metrology tool can be further configured to measure a physical parameter of the second post-bond wafer, the physical parameter of the second post-bond wafer represents information relating to topographical features of the second post-bond wafer, the model can further include an input indicative of the physical parameter of the second post-bond wafer and be configured to generate a third wafer bonding recipe in accordance with the physical parameter of the second post-bond wafer, and the wafer bonding tool can be further configured to bond a fifth wafer and a sixth wafer to each other in accordance with the third wafer bonding recipe to produce a third post-bond wafer.

In an embodiment, the metrology tool can be further configured to measure a physical parameter of the first wafer, the physical parameter of the first wafer represents information relating to topographical features of the first wafer, and the model can further include an input indicative of the physical parameter of the first wafer and be configured to generate the first wafer bonding recipe in accordance with the physical parameter of the first wafer. For example, the metrology tool can be further configured to measure a physical parameter of the second wafer, the physical parameter of the second wafer represents information relating to topographical features of the second wafer, and the model can generate the first wafer bonding recipe further based on the physical parameter of the second wafer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques, as described herein, pertain to wafer hybrid bonding using wafer metrology data to dynamically control the wafer bonding recipe to control post-bond wafer distortion. As an example, the wafer metrology data is provided to a model of the wafer bonding process to determine process conditions of the wafer bonding process that is predicted to produce post-bond wafers that meet a post-bond distortion threshold, which may then be applied to the actual bonding of the wafers. In other words, the wafer metrology data is used to tune a wafer bonding recipe that will produce post-bond wafers that meet the post-bond distortion threshold.

Figure 1A:
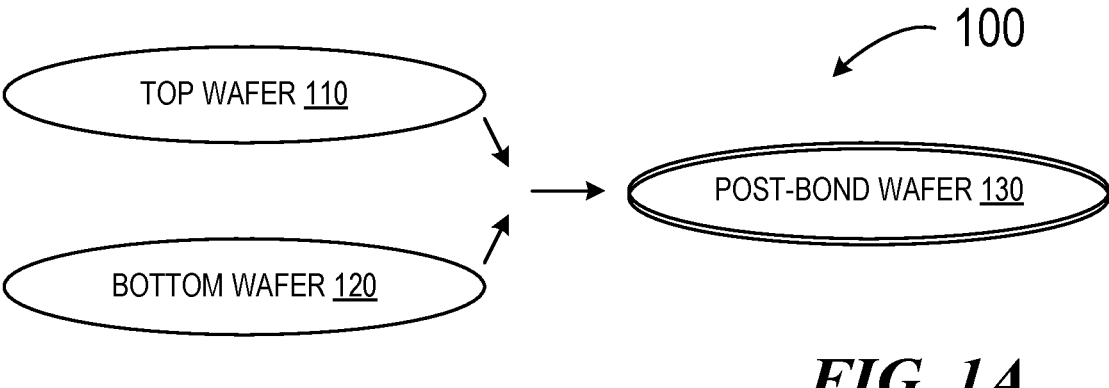
FIG. 1A illustrates a portion of a wafer-to-wafer bonding process for bonding two wafers using a hybrid bonding process.
Figure 1B:
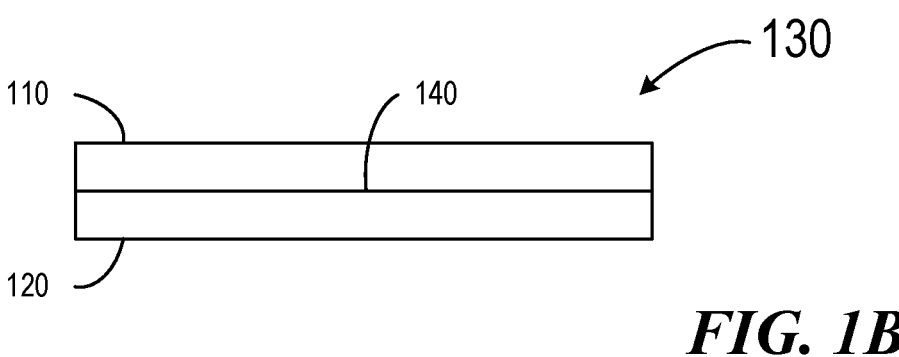
FIGS. 1B and 1C illustrate side-views of post-bond wafers.
Figure 1C:
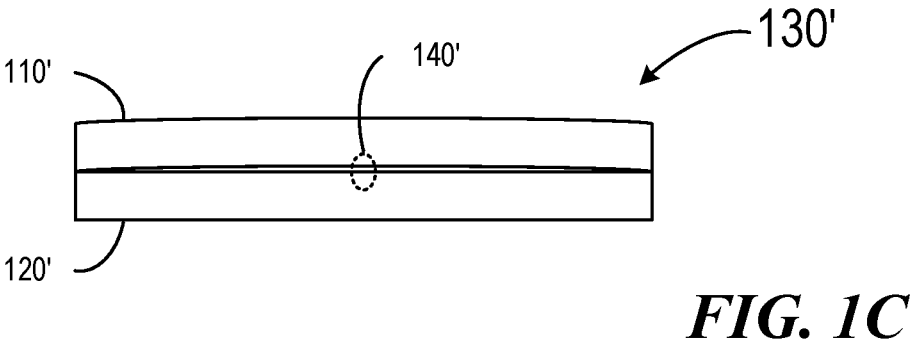
Figure 2:
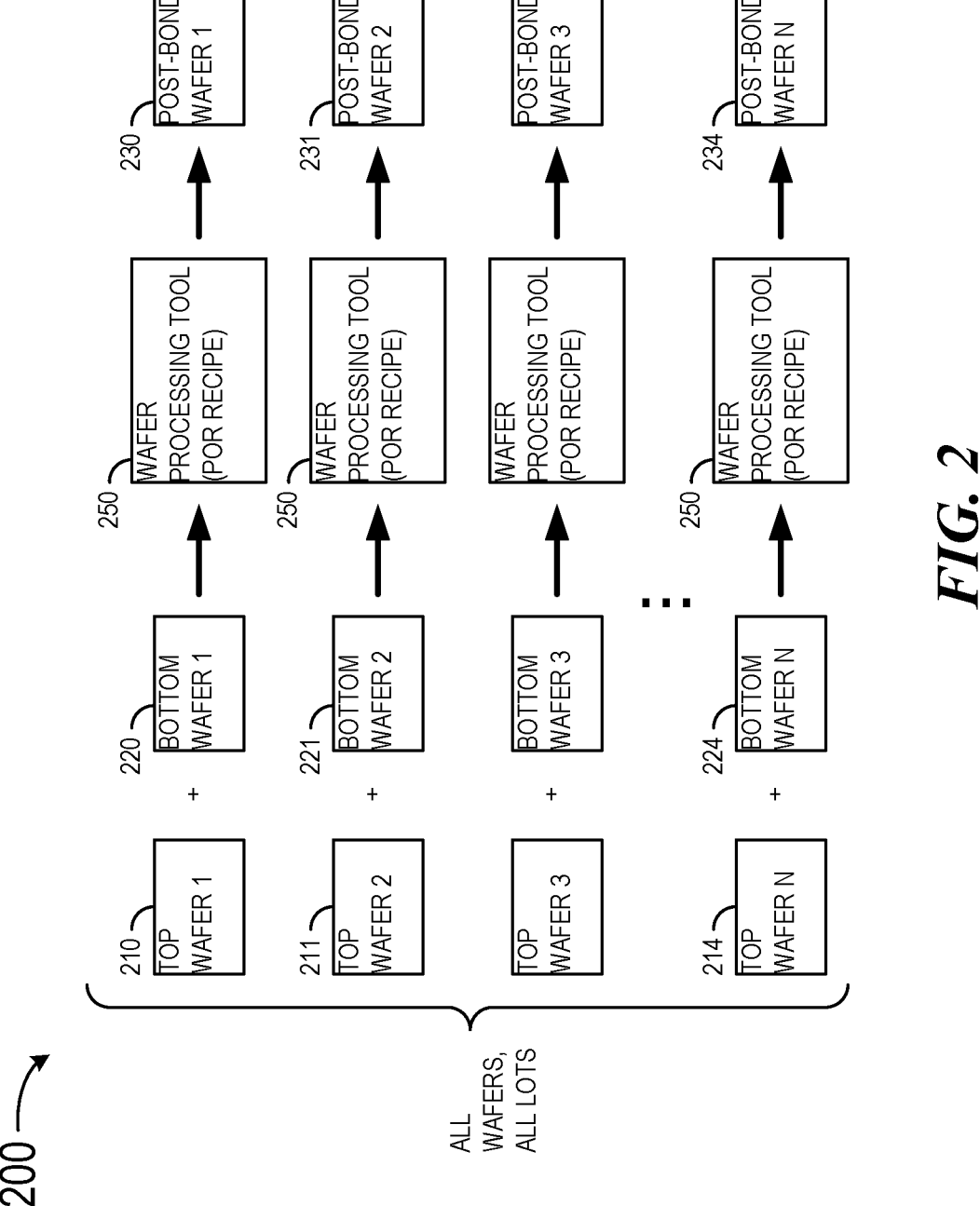
FIG. 2 illustrates a wafer hybrid bonding process.

FIG. 2 illustrates a wafer-to-wafer bonding process 200. In an embodiment, the wafer-to-wafer bonding process 200 can use a hybrid bonding process (there are special cases where only a single material etc. is used, which is referred to as direct bonding or fusion bonding). As shown in FIG. 2, a wafer processing tool 250 can fusion bonds, for example, a first top wafer 210 and a first bottom wafer 220 using a process of record (POR) wafer bonding recipe to form a first post-bond wafer 230. Typically, a plurality of top wafers can be bonded with a plurality of bottom wafers to form a plurality of post-bond wafers. As an example, a second top wafer 211 can be bonded with a second bottom wafer 221 to form a second post-bond wafer 231, and an N-th top wafer 214 can be bonded with an N-th bottom wafer 224 to form an N-th post-bond wafer 234. The annealing stage of the wafer bonding process 200 is not shown in FIG. 2.

In the wafer bonding process 200, the same POR wafer bonding recipe is used for all of the top and bottom wafers 210-214 and 220-224, independent of if the top and bottom wafers 210-214 and 220-224 belong to the same respective wafer lots or not.

Wafers are commonly processed in lots. One lot may contain up to 25 wafers with one of the 25 wafers being a monitor wafer that may or may not be used in the bonding process, for example. Inter-lot wafer variation is a significant contributor to post-bond wafer distortion. Production wafers usually vary from one lot to another, possibly due to processing conditions due to process control variations of prior steps, intrinsic wafer deformation, or other less obvious factors. The variation between wafers is referred to as the shape variation. The shape variation can be local, meaning an averaged surface map of one lot of wafers looks entirely different from an averaged surface map of another lot of wafers, with one standard deviation of the shape variation ranging from 1 µm up to 5 µm in 300 mm wafers with logic devices, for example. The shape variation may be different in wafers with memory devices. The shape variation can also be global, meaning the peak-to-valley variation can be on the order of 10 µm or more from lot to lot. For memory applications, it is possible that the shape variation is much larger. Intra-lot variation is usually small, except in the case of split lots. A split lot means that subsets of the wafers within a lot are separated and are processed differently. When split lots are not considered, the intra-lot variation is typically far less than 10% of the inter-lot variation, however actual values may differ depending on the wafers being considered.

The shape variation is directly correlated to in-plane distortion (or simply referred to as "distortion") The in-plane distortion of a wafer is defined as deviation along the major plane of the wafer, can occur in a nominally flat wafer, and is represented by material movement in the major (meridional) plane, i.e., stretching and expansion causing density of material to be non-uniform. Observations have shown that 1 µm of shape variation may be attribute to approximately 5 nm of in-plane distortion. Therefore, in-plane distortion is a critical metric for wafer bonding process performance.

One way to evaluate the quality of a wafer bonding process is to examine the post-bond wafer. For example, if the shape variation of the post-bond wafers is high, then the wafer bonding process may not be well tuned to the wafers being bonded. While if the shape variation of the post-bond wafers is low, then the wafer bonding process may be well tuned to the wafers being bonded. As another example, if the shape variation of the post-bond wafers is low for intra-lot wafers but is high for inter-lot wafers, then the wafer bonding process may be well tuned for the particular lot of wafers, but not for a different lot of wafers.

In the case where both wafers being bonded are patterned (i.e., both wafers include devices and/or structures), the alignment between the patterns of the two wafers along the bonding interface is important. Alignment marks on each patterned wafer may be measured by a scanner at a post-bonding step. The scanner measurement step may not be necessarily performed immediately after the bonding step. As an example, the post-bond wafer may be annealed in a processing chamber at elevated temperature (hundreds of degrees Celsius, for example) to improve the bonding strength between the two Wafers. As another example, one of the wafers may be thinned by grinding to expose the bonding interface. Other less obvious steps may also exist in between the wafer bonding step and the post-bond metrology step. In any case, the absolute shift between the two wafers of the post-bond wafer is of critical importance. Typical post-bond alignment error at one standard deviation variation can be about 30 nm, for example.

In the case where only one wafer is patterned, the post-bond distortion of the patterned wafer is important. The post-bond distortion may be a function of the shape variation of both pre-bond wafers, as well as the wafer bonding process. Some important factors that determine the post-bond distortion include the temperature distribution of the wafers, chucking forces on the wafers, adhesion between the wafers, surface roughness of the bonding surfaces of the two wafers, chuck flatness, spacing between the wafers prior to the bonding process, pre-cleaning of the two target bonding surfaces, and many other factors not listed here. After bonding, the post-bond distortion may be measured by the scanner as well, similar to the case where both wafers are patterned. However, in this case, the post-bond distortion is defined as the absolute deviation from an ideal distortion. The ideal distortion may be defined by the scanner. There are many models that the scanner may adopt to define the ideal distortion. Traditionally, the scanner uses a 6-term model for the ideal distortion. The 6 terms include magnification and tilt of the distortion surface maps. More recently, models have become more complicated, for example, a 33-term model has been proposed. Some state-of-the-art technology support free-form models (thousands of terms). A challenge that arises from selecting one of the high complexity models is that the time and cost required to create such model becomes unfeasible in the production environment.

Furthermore, post-bond distortion is becoming an increasingly difficult production target to meet. As an example, the current state-of-the-art post-bond distortion threshold has a one standard deviation of 10 nm or less, with customer requirements for post-bond distortion continuing to decrease in both the near term and the long term.

Because the wafer bonding process 200 shown in FIG. 2 uses a single POR wafer bonding recipe to bond wafers (independent of whether or not the wafers being bonded are intra-lot or inter-lot wafers), the bonding process related factors that impact post-bond distortion (i.e., the factors that are controlled by the POR wafer bonding recipe, such as temperature distribution of the wafers, chucking forces on the wafers, chuck flatness, spacing between the wafers prior to the bonding process, pre-cleaning of the two target bonding surfaces, and so on) remain fixed, while shape variation of the wafers changes between individual wafers and wafer lots. Therefore, inter-lot post-bond distortion control may be poor because inter-lot shape variation may be large and the fixed wafer bonding recipe does not compensate for inter-lot shape variation.

According to an example embodiment, a wafer bonding system is provided that utilizes wafer metrology data to tune a wafer bonding recipe. The wafer metrology data is provided to a model of the wafer bonding process, and the model tunes the process conditions of the wafer bonding recipe to produce post-bond wafers that meet a post-bond distortion threshold.

While post-bond distortion directly measured on the wafer is important, the cost involved in performing this measurement is high for research and development purposes. For example, the time to perform all of the aforementioned bonding steps before the metrology step is very long, possibly on the order of weeks. In an embodiment, instead of direct post-bond distortion measurements, physical parameters, such as wafer shape data, of the wafer can be measured for the post-bond wafer and used as a proxy to estimate the post-bond distortion. As an example, the wafer shape data is the form of a high density gridded map of the topology of a freestanding wafer. The grid may have a lateral resolution of 0.5 mm, for example, and measured over the entire wafer. As an example, the wafer shape metrology should have a resolution of less than 1 nm in an out-of-plane direction, which may be defined as deviation along a plane orthogonal to the major plane of the wafer. The wafer shape data may be directly correlated to the distortion through geometric formulations. Examples of geometric formulations include those that correlate wafer shape data and distortion based on the theory of elasticity, beam theory, or free-form wafer shape measurements.

In an embodiment, the wafer metrology data includes metrology data for pre-bond wafers (e.g., wafer metrology data for the top wafers, the bottom wafers, or both the top and bottom wafers), and the wafer metrology data can be provided to the model to tune the process conditions of the wafer bonding recipe to produce post-bond wafers that meet the post-bond distortion threshold. In other words, the model is used to tune the process conditions of the wafer bonding recipe to produce post-bond wafers that meet the post-bond distortion threshold, given the wafer metrology data of the pre-bond wafers. The model predicts the post-bond distortion of the post-bond wafers based on the wafer metrology data of the pre-bond wafers and tunes the wafer bonding recipe to produce post-bond wafers that meet the post-bond distortion threshold. This mode of operation is referred to as feedforward operation. A detailed description of feedforward operation is provided below.

In an embodiment, the wafer metrology data can include metrology data for post-bond wafers, and the wafer metrology data is provided to the model to tune the process conditions of the wafer bonding recipe to produce post-bond wafers that meet the post-bond distortion threshold. In other words, the model is used to tune the process conditions of the wafer bonding recipe, based on the metrology data of the post-bond wafers, to produce post-bond wafers that meet the post-bond distortion threshold. This mode of operation is referred to as feedback operation. A detailed description of feedback operation is provided below.

In an embodiment, the wafer metrology data can include metrology data for both pre-bond wafers and post-bond wafers, and the metrology data is provided to the model to tune the process conditions of the wafer bonding recipe to product post-bond wafers that meet the post-bond distortion threshold. Because the metrology data of both the pre-bond wafers and the post-bond wafers is available, the model may be used to both predict the post-bond distortion of the post-bond wafers based on the wafer metrology data of the pre-bond wafers and tune the process conditions of the wafer bonding recipe, based on the metrology data of both the pre- and post-bond wafers, to produce post-bond wafers that meet the post-bond distortion threshold.

Figure 3:
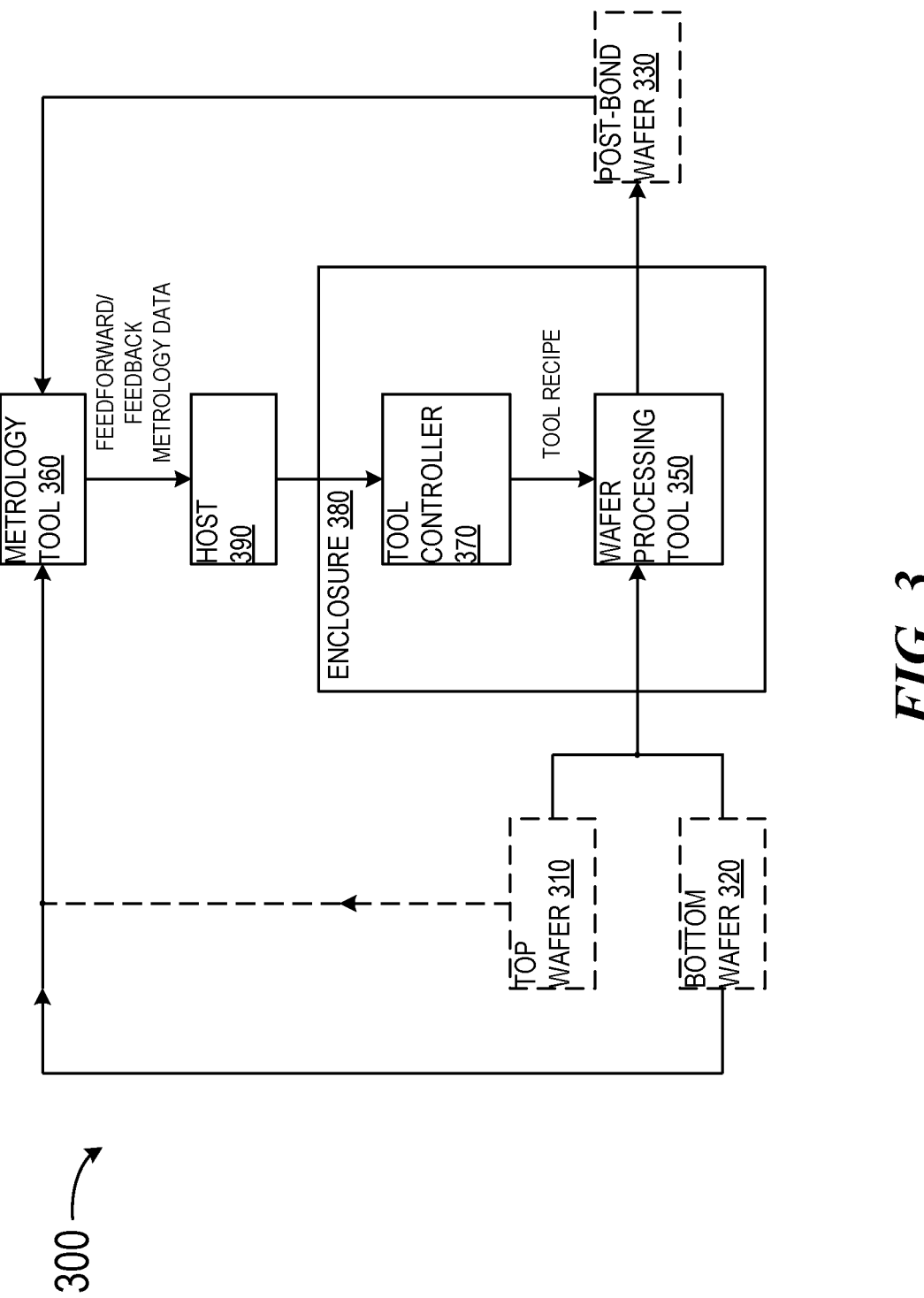
FIG. 3 illustrates a wafer bonding system that utilizes wafer metrology data to tune a wafer bonding recipe.

FIG. 3 illustrates a wafer bonding system 300 that utilizes wafer metrology data to tune a wafer bonding recipe for a wafer bonding tool to bond wafers. In an embodiment, the wafer bonding system 300 can use wafer metrology data of pre-bond wafers (either a top wafer, a bottom wafer, or both the top and bottom wafers, which are to be bonded to each other in the wafer bonding system 300) (referred to as "feedforward metrology data") and/or wafer metrology data of a post-bond wafer (that is formed by bonding the top wafer and the bottom wafer to each other in the wafer bonding system 300) (referred to as "feedback metrology data"), to tune process conditions (e.g., temperature, voltage, pressure, and so on) of a tool recipe, e.g., a wafer bonding recipe, for a water processing tool, e.g., a wafer bonding tool, to produce post-bond wafers that meet a post-bond distortion threshold.

In an embodiment, the wafer bonding system 300 can include a wafer processing tool 350. e.g., a wafer bonding tool, that is configured to bond pre-bond wafers (e.g., a top wafer 310 and a bottom wafer 320) to each other to produce a post-bond wafer 330 based on a tool recipe, e.g., a wafer bonding recipe, that is generated by a tool controller 370. The wafer processing tool 350 is widely available commercially. In an embodiment, the tool controller 370 and the wafer processing tool 350 can be located within an enclosure 380. The water bonding system 300 can also include a metrology tool 360 that is configured to measure the physical parameters, such as wafer shape data, of the top wafer 310, the bottom wafer 320, or both the top wafer 310 and the bottom wafer 320. The physical parameters of the top wafer 310 and the bottom wafer 320 can be referred to as feedforward metrology data. An example of the metrology tool 360 can be a surface profilometer. Another example of the metrology tool 360 can be a lithography surface scanner, such as atomic force microscopy tools, critical-dimension scanning electron microscopes, and so on. The physical parameters may be provided to the tool controller 370 to tune the wafer bonding recipe, which can be used by the wafer processing tool 350 to bond the pre-bond wafers so that the resulting post-bond wafer 330 meets post-bond distortion parameters.

As shown in FIG. 3, the wafer bonding system 300 is configured to bond pre-bond wafers where the top wafer 310 is a carrier wafer and the bottom wafer 320 is a patterned wafer, hence it may not be necessary to measure the physical parameters of the top wafer 310. Therefore, the line between the top wafer 310 and the metrology tool 360 is shown as a dashed line. However, in a different configuration, the physical parameters of the top wafer 310 may also be obtained and used to tune the wafer bonding recipe even when the top wafer 310 is a carrier wafer. Furthermore, in a situation where the top wafer 310 is a patterned wafer and the bottom wafer 320 is a carrier wafer, the physical parameters of the top wafer 310 would be measured and provided to the wafer processing tool 350 to tune the wafer bonding recipe, while the measuring of the physical parameters of the bottom wafer 320 may be optional. In a situation where both the top wafer 310 and the bottom wafer 320 are patterned, the physical parameters of both the top wafer 310 and the bottom wafer 320 should be measured and provided to the tool controller 370 to tune the wafer bonding recipe, which can be used by the wafer processing tool 350.

In an embodiment, the metrology tool 360 can be further configured to measure the physical parameters of the post-bond wafer 330, which may also be provided to the tool controller 370 to tune the wafer bonding recipe, which can be used by the wafer processing tool 350, to help ensure that post-bond wafers meet post-bond distortion parameters. The physical parameters of the post-bond wafer 330 can be referred to as feedback metrology data.

In the example embodiment shown in FIG. 3, the metrology tool 360 is standalone, separate from the wafer processing tool 350, and can be disposed anywhere in a fab. In an embodiment, the wafer bonding system 300 further includes a host 390 that interfaces with the tool controller 370 and is configured to send the physical parameters of the top wafer 310, the bottom wafer 320 and the post-bond wafer 330 (feedforward and feedback metrology data) measured by the metrology tool 360 to the tool controller 370, for the tool controller 370 to tune the wafer bonding recipe based on the feedforward and feedback metrology data, and the wafer processing tool 350 to bond subsequent top and bottom wafers based on the tuned wafer bonding recipe.

Figure 4:
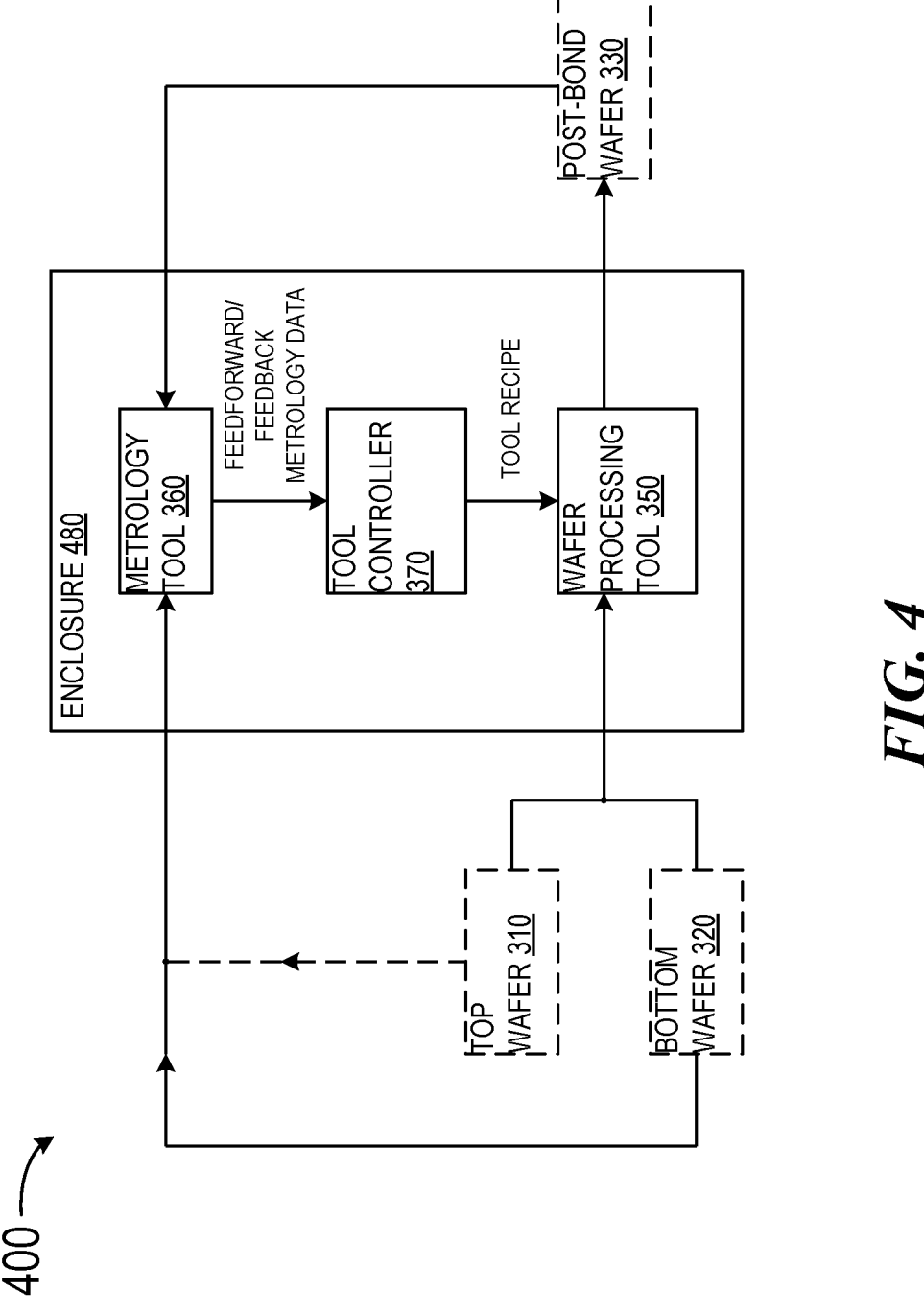
FIG. 4 illustrates a wafer bonding system that utilizes wafer metrology data to tune a wafer bonding recipe according to example embodiments presented herein.

FIG. 4 illustrates a wafer bonding system 400 according to some embodiments of the present disclosure. The wafer bonding system 400 also utilizes wafer metrology data, e.g., feedforward metrology data of pre-bond wafers (e.g., the top wafer 310 and the bottom wafer 320) and feedback metrology data of a post-bond wafer (e.g., the post-bond wafer 330), to tune a wafer bonding recipe for a wafer bonding tool to bond two wafers. In an embodiment, the wafer bonding system 400 can also include the metrology tool 360, the tool controller 370 and the wafer processing tool 350. Different from the wafer bonding system 300, in which the metrology tool 360 is standalone, separate from the wafer processing tool 350 and thus the host 390 is required to interface the metrology tool 360 and the tool controller 370 to send the feedforward and feedback metrology data obtained by the metrology tool 360 to the tool controller 370, the wafer bonding system 400 integrates the metrology tool 360 with the tool controller 370 and the wafer processing tool 350. Therefore, the tool controller 370 can obtain the feedforward and feedback metrology data from the metrology tool 360 directly, without communicating with the host 390. In an embodiment, the metrology tool 360, the tool controller 370 and the wafer processing tool 350 can be located within an enclosure 480 and integrated with each other, and the tool controller 370 can tune the wafer bonding recipe based on the feedforward and feedback metrology data transferred from the metrology tool 360 directly, without communicating with external world.

Figure 5:
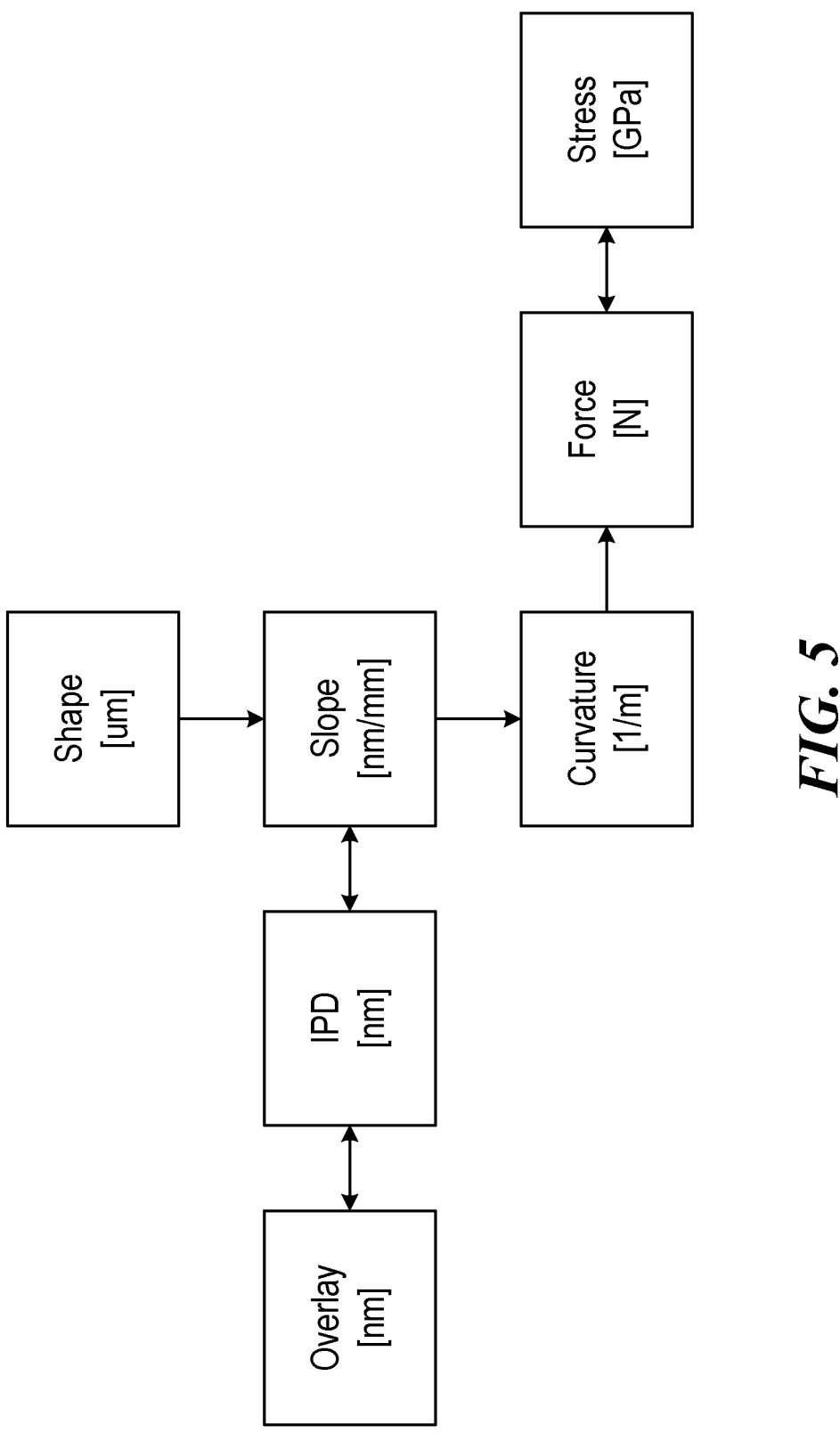
FIG. 5 illustrates the relationship between different wafer metrology data of wafers.
Figure 6A:
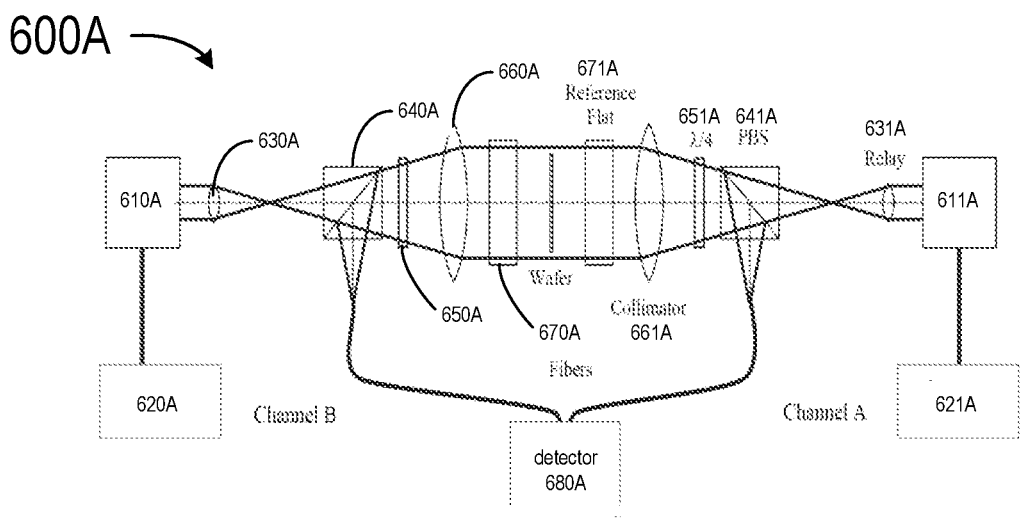
FIGS. 6A to 6F illustrate different metrology tools according to example embodiments presented herein.
Figure 6B:
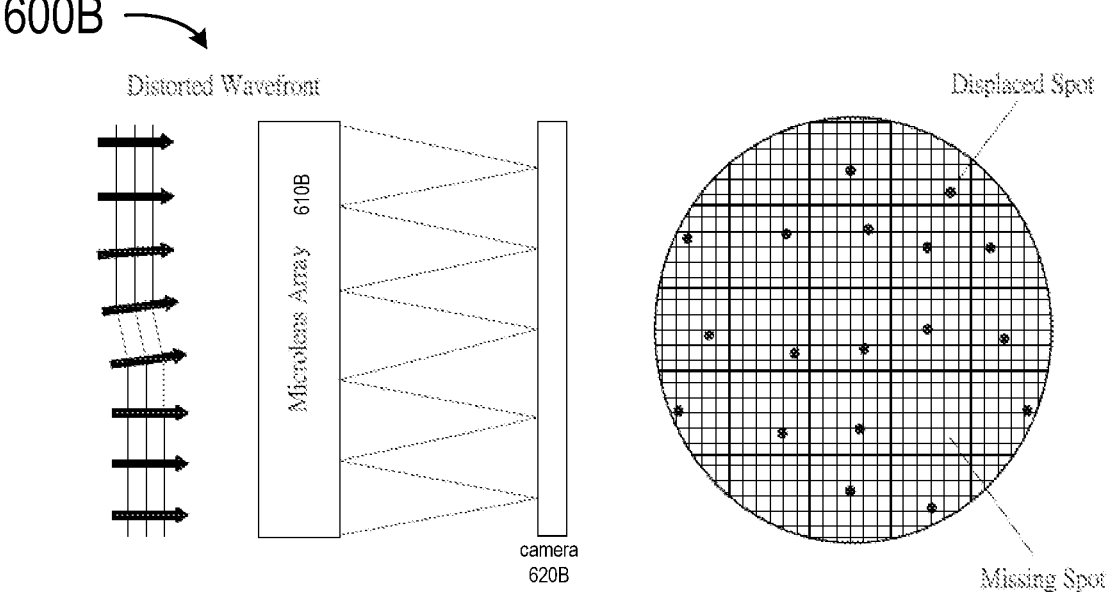
Figures 6C, 6D, 6E:
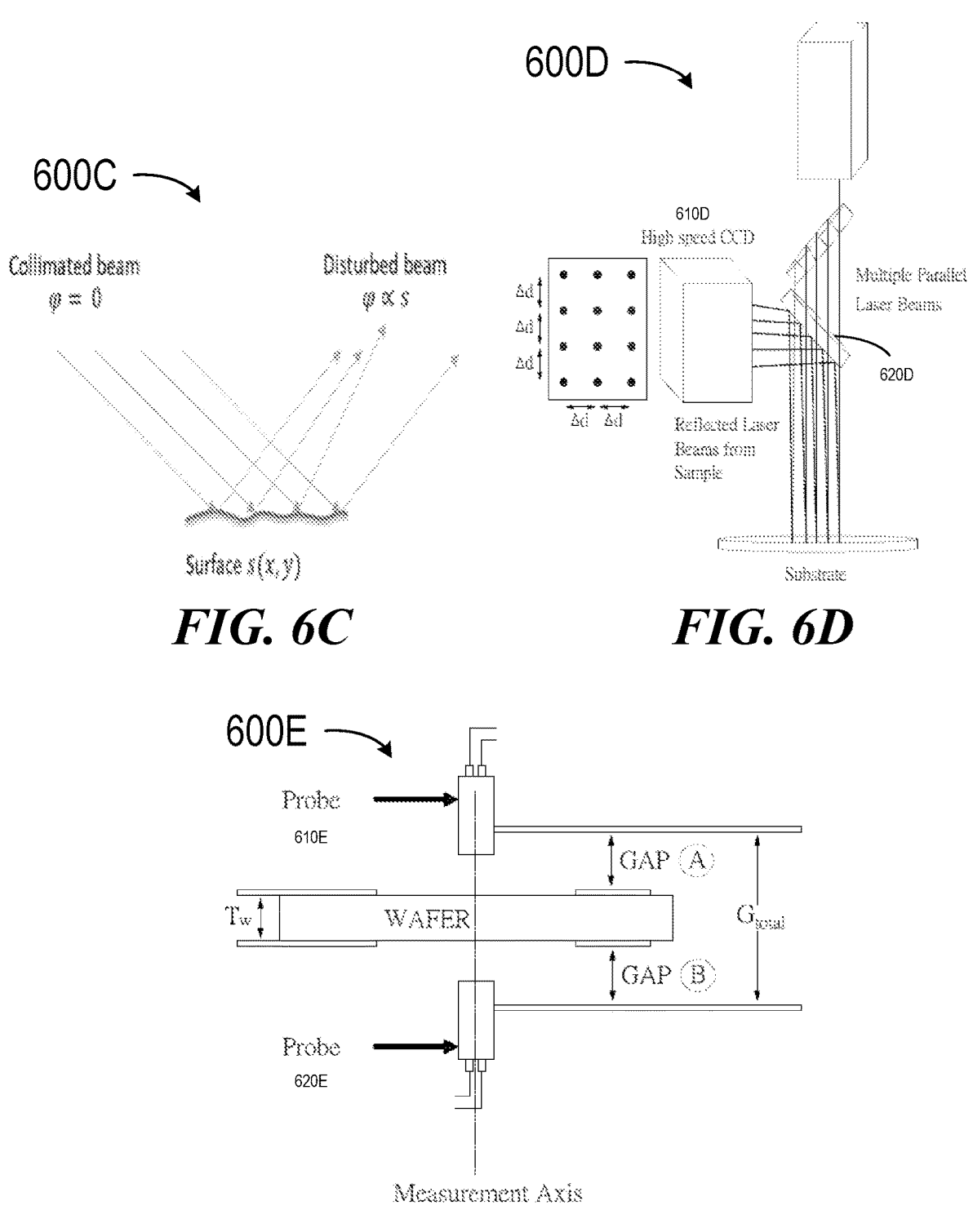
Figure 6F:
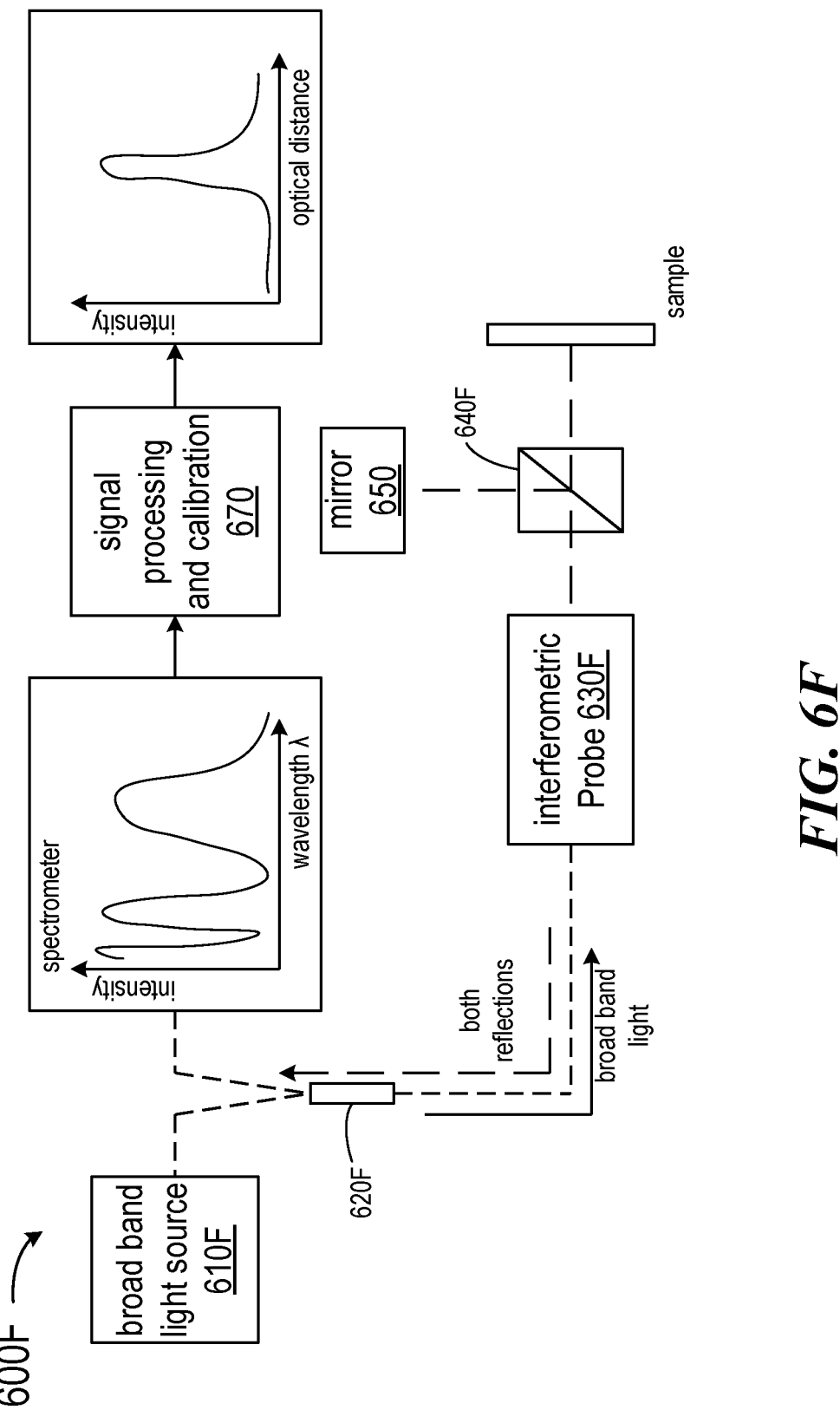

In an embodiment, the wafer metrology data can include the shape, overlay, in-plane displacement (IPD), slope, curvature, force, stress, etc. of the pre- and post-bond wafers, which are listed in FIG. 5. FIG. 5 highlights the relationship between the different wafer metrology data, and the metrology tool 360 can measure any one of the items, and the item can be used to calculate and determine another of the items. For example, the metrology tool 360 can measure the slope of a wafer, and the slope can be used to calculate and determine the shape of the wafer. Accordingly, the metrology tool 360 can be configured to measure these different wafer metrology data. For example, the metrology tool 360 can include a dual Fizeau interferometer 600A, as shown in FIG. 6A, which can be configured to measure the IPD of a wafer and include first and second cameras 610A and 611A, first and second computers 620A and 621A, first and second relay lens 630A and 631A, first and second polarizing beam splitter (PBS) 640A and 641A, first and second N/4 waveplates 650A and 651A, first and second collimators 660A and 661A, first and second reference flats 670A and 671A and a detector 680A; a Shack-Hartmann sensor 600B, as shown in FIG. 6B, which can be configured to measure the slope of a wafer and include a lenslet array 610B where a wavefront enters and a camera 620B on which a spot field is created; a wavefront phase sensor 600C, as shown in FIG. 6C, which can be configured to measure the slope of a wafer; a multi-beam reflectometry 600D, as shown in FIG. 6D, which can be configured to measure the curvature of a wafer and include a camera (e.g., charge-coupled devices (CCDs) 610D and a lens assembly 620D; capacitance sensors, as shown in FIG. 6E, which can be configured to measure the IPD of a wafer and include first and second probes 610E and 620E, the thickness $T_w$ of the wafer being the distance $G_{total}$ between the first and second probes 610E and 620E minus the first and second distances $GAP_A$ and $GAP_B$ from the first and second probes 610E and 620E to the wafer, respectively; and a scanning interferometric sensor 600F, as shown in FIG. 6F, which can be configured to measure the thickness and topography of a wafer and include a broad band light source 610F, an optical coupler or beam splitter 620F, an interferometric probe 630F, a PBS 640F and a mirror 650F.

Figure 7:
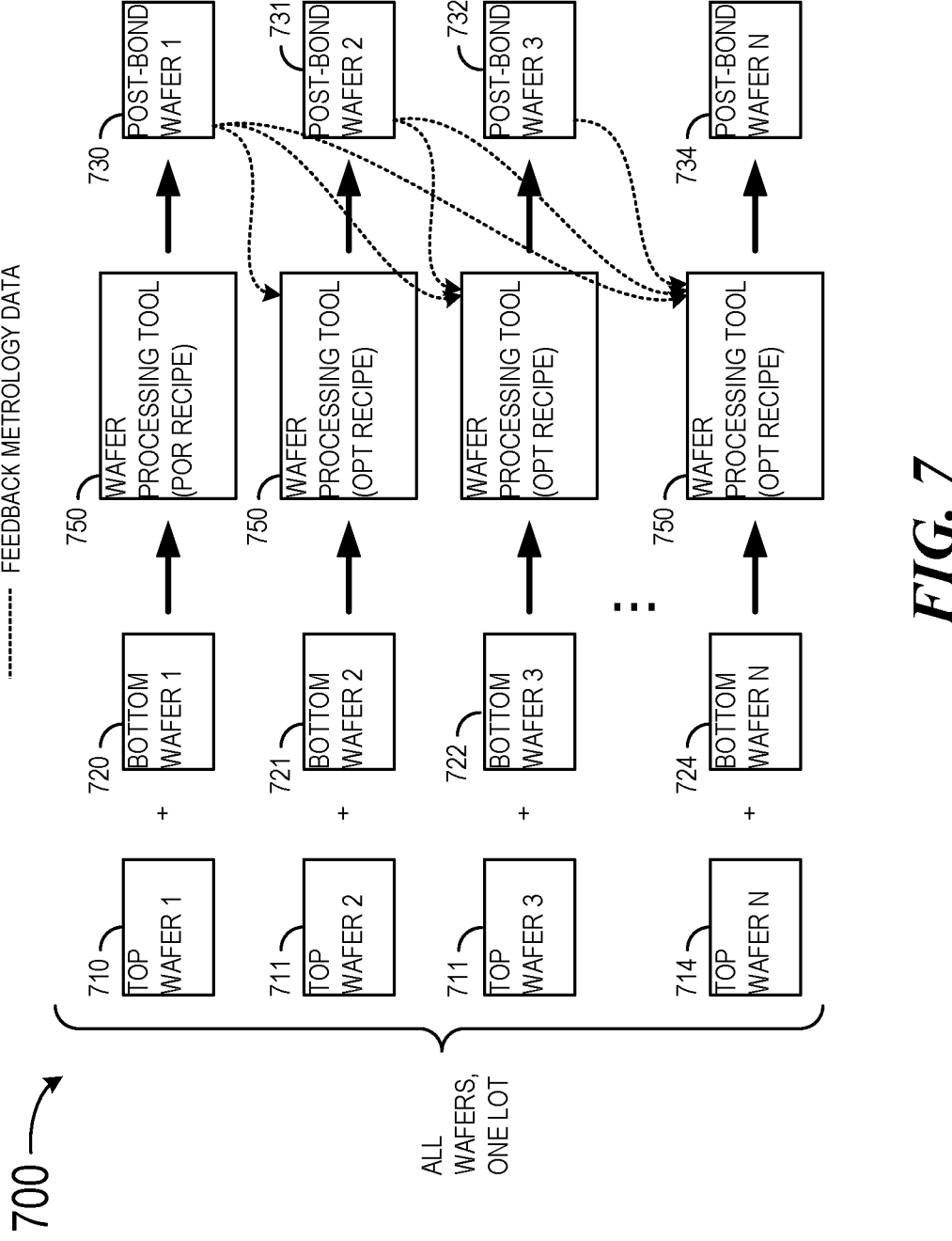
FIG. 7 illustrates a wafer hybrid bonding process with example feedback operation according to example embodiments presented herein.

FIG. 7 illustrates a wafer fusion bonding process 700 with an example feedback operation according to example embodiments presented herein. The wafer fusion bonding process 700 can be performed in the wafer bonding system 300 and 400. As shown in FIG. 7, a wafer processing tool 750, e.g., the wafer processing tool 350, fusion bonds a first top wafer 710 and a first bottom wafer 720 using a POR wafer bonding recipe (shown in FIG. 7 as "POR RECIPE") to form a first post-bond wafer 730. Distortion data (e.g., physical parameters) of the first post-bond wafer 730 (as measured by a metrology tool, e.g., the metrology tool 360, and referred to as "feedback metrology data") is provided to a tool controller, e.g., the tool controller 370, to tune and optimize the wafer bonding recipe (shown in FIG. 7 as "OPT RECIPE"), which can be used by the wafer processing tool 750 to bond subsequent top wafers (e.g., a second top wafer 711 and an N-th top wafer 714) and subsequent bottom wafers (e.g., a second bottom wafer 721 and an N-th bottom wafer 724) to produce subsequent post-bond wafers (e.g., a second post-bond wafer 731 and an N-th post-bond wafer 734). In situations where the subsequent wafers are part of the same lot as the corresponding first wafers, the wafer fusion bonding process 700 with the feedback operation may be capable of producing post-bond wafers with a wafer bonding recipe optimized for the relatively small variations seen in same lot wafers.

In an embodiment, distortion data (e.g., physical parameters) of the subsequent post-bond wafers, such as the second post-bond wafer 731, may be measured and provided to the tool controller 370 to further tune and optimize the wafer bonding recipe, for the wafer processing tool 750 to bond subsequent top and bottom wafers. As an example, the distortion data of the second post-bond wafer 731 can be measured by the metrology tool 360 and provided to the tool controller 370 to further tune and optimize the wafer bonding recipe so that the wafer processing tool 750 can use the further tuned and optimized wafer boding recipe to bond subsequent third top wafer 712 and third bottom wafer 722 to produce a third post-bond wafer 732. Then, the distortion data (e.g., the physical parameters) of the third post-bond wafer 732 can be measured by the metrology tool 360 and provided to the tool controller 370 to further tune and optimize the wafer bonding recipe, which can be used by the wafer processing tool 750 to bond subsequent fourth top and bottom wafers to produce a fourth post-bond wafer, and so on.

In an embodiment, in a situation where multiple wafer processing tools are used to perform wafer fusion bonding, the distortion data of first post-bond wafer 730 can be provided to multiple tool processors corresponding to the multiple wafer processing tools to separately tune and optimize the wafer bonding recipe. In another embodiment, in a situation where multiple wafer processing tools are used to perform wafer fusion bonding, the optimized wafer bonding recipe can be shared between the multiple wafer processing tools.

Figure 8:
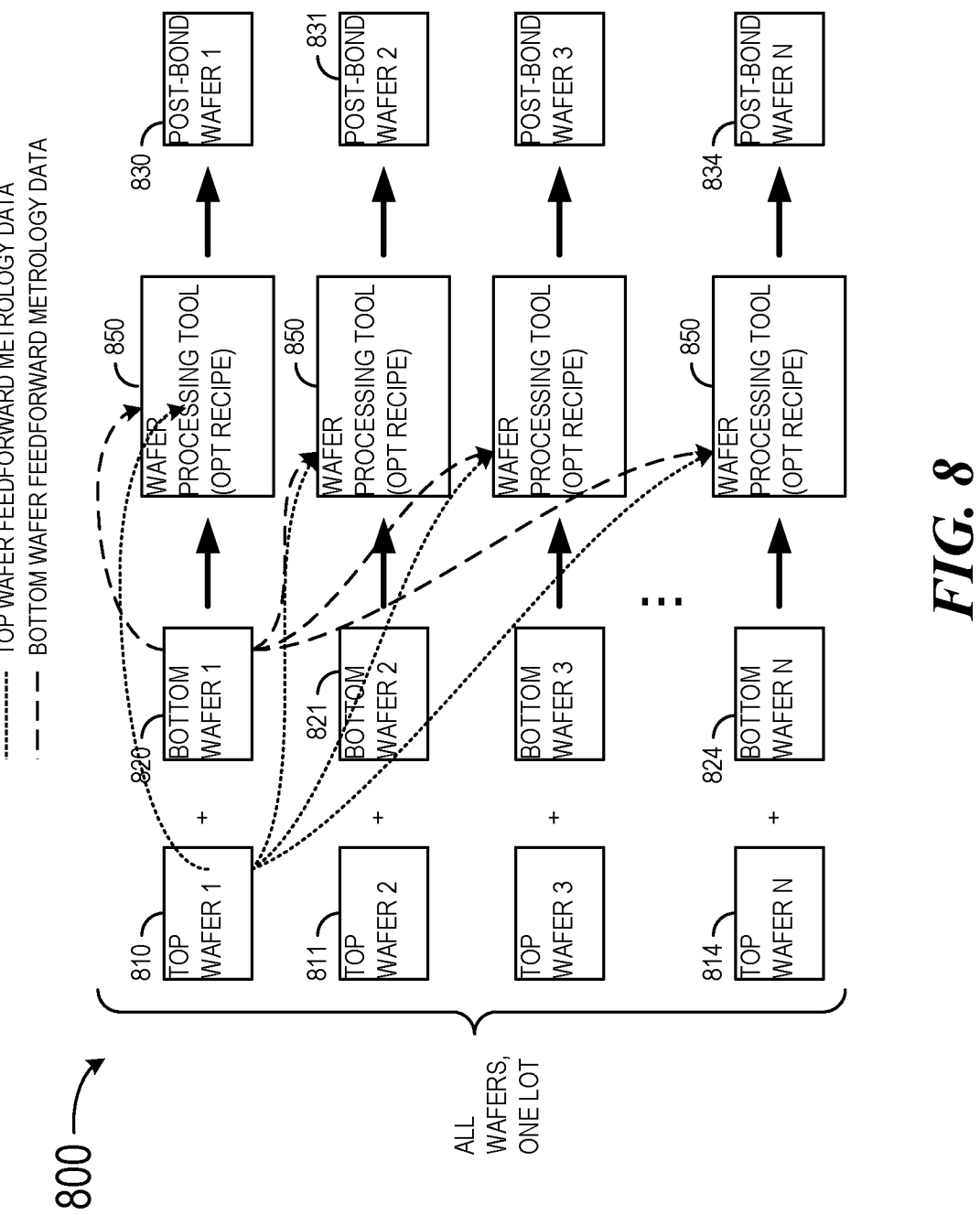
FIG. 8 illustrates a wafer hybrid bonding process with a first example feedforward operation according to example embodiments presented herein.

FIG. 8 illustrates a wafer fusion bonding process 800 with a first example feedforward operation according to example embodiments presented herein. The wafer fusion bonding process 800 can be performed in the wafer bonding system 400. As shown in FIG. 8, a wafer processing tool 850, e.g., the wafer processing tool 350, uses a tuned and optimized wafer bonding recipe (shown in FIG. 8 as "OPT RECIPE") to bond a first top wafer 810 and a first bottom wafer 820 to form a first post-bond wafer 830. The optimized wafer bonding recipe can be generated by tuning and optimizing a previous wafer bonding recipe. The physical parameters of the first top wafer 810 and the first bottom wafer 820 may be measured by a metrology tool, e.g., the metrology tool 360, before they are used to optimize the previous wafer bonding recipe to maximize the time available to optimize the previous wafer bonding recipe. As an example, the physical parameters of the first top wafer 810 and the first bottom wafer 820 can be measured by the wafer processing tool 350 as the first top and bottom wafers 810 and 820 are received at the wafer fabrication facility (potentially a significant amount of time before they are actually bonded). As another example, the physical parameters of the first top wafer 810 and the first bottom wafer 820 can be measured by the metrology tool 360 as the first top and bottom wafers 810 and 820 are loaded into the wafer processing tool 750. In an embodiment, the wafer processing tool 850 can bond subsequent top wafers (e.g., a second top wafer 811 and an N-th top wafer 814) and subsequent bottom wafers (e.g., a second bottom wafer 821 and an N-th bottom wafer 824) in accordance with the optimized wafer bonding recipe to produce subsequent post-bond wafers (e.g., a second post-bond wafer 831 and an N-th post-bond wafer 834). An advantage of the wafer fusion bonding process 800 is that (within a wafer lot) all of the wafers are bonded using a wafer bonding recipe optimized for the relatively small variations seen in same lot wafers.

In an embodiment, in a situation where one of the two pre-bond wafers is patterned (e.g., the top wafer is patterned and the bottom wafer is a carrier wafer or the bottom wafer is patterned and the top wafer is a carrier wafer), only the physical parameters of the patterned wafer is used to optimize the wafer bonding recipe. As an example, in the situation when the top wafer is patterned and the bottom wafer is a carrier wafer, a tool controller, e.g., the tool controller 370, can use the physical parameters of the first top wafer 810 to optimize the wafer bonding recipe, and the wafer processing tool 850 can use the optimized wafer bonding recipe to bond the first top wafer 810 and the first bottom wafer 820. As another example, in the situation when the bottom wafer is patterned and the top wafer is a carrier wafer, the tool controller 370 can use the physical parameters of the first bottom wafer 820 to optimize the wafer bonding recipe, and the wafer processing tool 850 can use the optimized wafer bonding recipe to bond the first top wafer 810 and the first bottom wafer 820.

In an embodiment, in a situation where multiple wafer processing tools are used to perform wafer fusion bonding, the physical parameters of the first top wafer 810 and the first bottom wafer 820 can be provided to multiple tool processor corresponding to the multiple wafer processing tools to separately optimize the wafer bonding recipe. In another embodiment, in a situation where multiple wafer processing tools are used to perform wafer fusion bonding, the optimized wafer bonding recipe can be shared between the multiple wafer processing tools.

Figure 9:
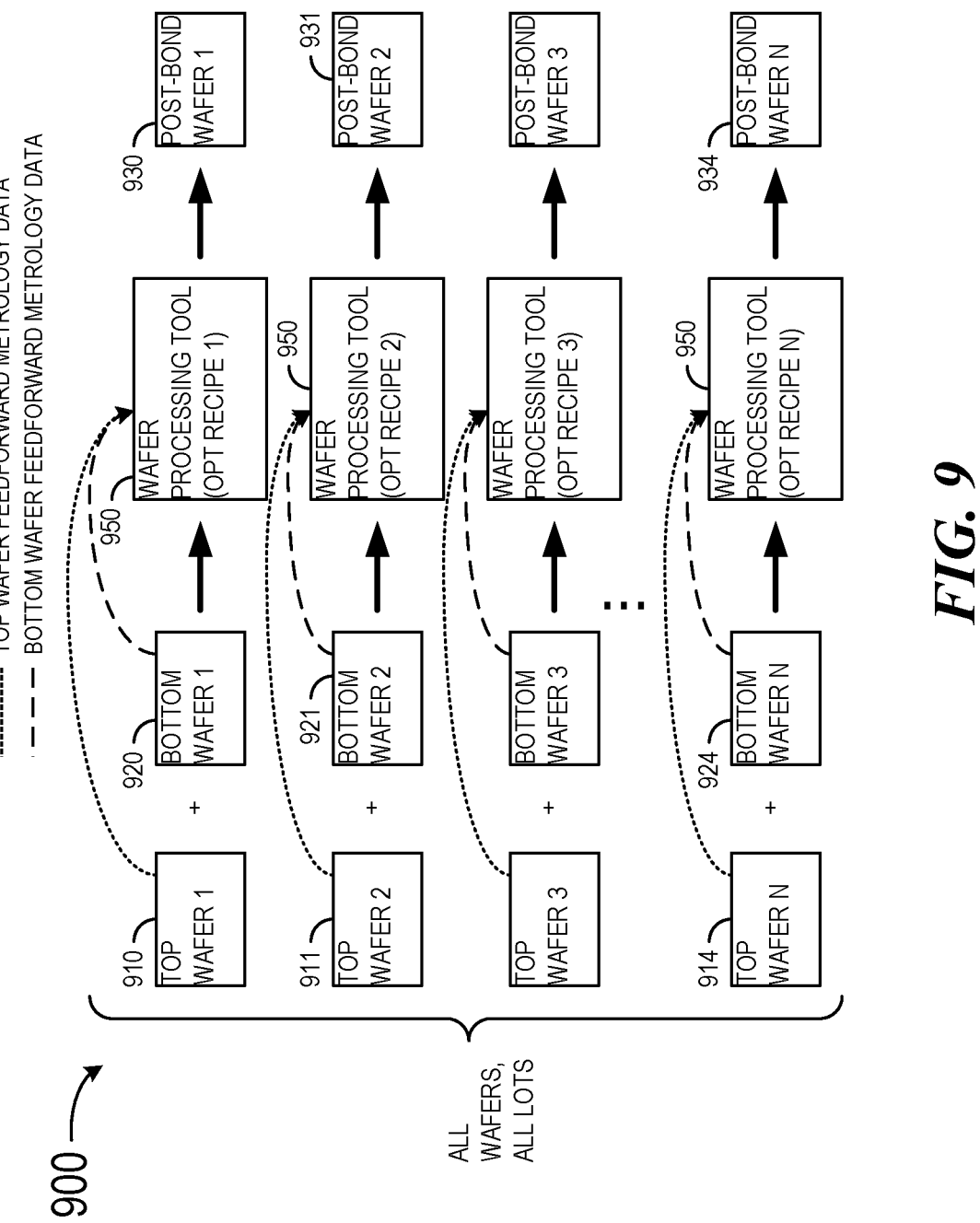
FIG. 9 illustrates a wafer hybrid bonding process with a second example feedforward operation according to example embodiments presented herein.

FIG. 9 illustrates a wafer fusion bonding process 900 with a second example feedforward operation according to example embodiments presented herein. The wafer fusion bonding process 900 can be performed in the wafer bonding system 400. As shown in FIG. 9, a wafer processing tool 950, e.g., the wafer processing tool 350, uses a tuned and optimized wafer bonding recipe (shown in FIG. 9 as "OPT RECIPE 1") to bond a first top wafer 910 and a first bottom wafer 920 to form a first post-bond wafer 930. The optimized wafer bonding recipe can be generated by tuning and optimizing a previous wafer bonding recipe. The physical parameters of the first top wafer 910 and the first bottom wafer 920 may be measured by a metrology tool, e.g., the metrology tool 360, before they are used to optimize the previous wafer bonding recipe to maximize the time available to optimize the previous wafer bonding recipe. As an example, the physical parameters of the first top wafer 910 and the first bottom wafer 920 can be measured by the metrology tool 360 as the first top wafer 910 and the first bottom wafer 920 are received at the wafer fabrication facility (potentially a significant amount of time before they are actually bonded). As another example, the first top wafer 910 and the first bottom wafer 920 may be measured by the metrology tool 360 as the first top wafer 910 and the first bottom wafer 920 are loaded into the wafer bonding tool. Physical parameters of subsequent top wafers and subsequent bottom wafers can be used to optimize the wafer bonding recipes used to form subsequent post-bond wafers. As an example, physical parameters of a second top wafer 911 and a second bottom wafer 912 can be measured by the metrology tool 360 and used by a tool controller, e.g., the tool controller 370, to optimize a wafer bonding recipe used to form a second post-bond wafer 931. Similarly, physical parameters of an N-th top wafer 914 and an N-th bottom wafer 924 can be measured by the metrology tool 360 and used by the tool controller 370 to optimize a wafer bonding recipe used to form an N-th post-bond wafer 934. An advantage of the wafer fusion bonding process 900 is that the wafer bonding recipe is individually optimized for the wafers being bonded, independent of wafer lot.

In an embodiment, in a situation where one of the two pre-bond wafers is patterned (e.g., the top wafer is patterned and the bottom wafer is a carrier wafer), only the physical parameters of the patterned wafer is used to optimize the wafer bonding recipe. As an example, the tool controller 370 can use the physical parameters of the first top wafer 910 to tune and optimize the wafer bonding recipe used to bond the first top wafer 910 and the first bottom wafer 920 to form the first post-bond wafer 930.

In an embodiment, a combination of feedforward and feedback optimization of the wafer bonding recipe is used. In such an embodiment, both the physical parameters of the pre-bond wafers and the distortion data of post-bond wafers are used to optimize the wafer bonding recipes.

Figure 10:
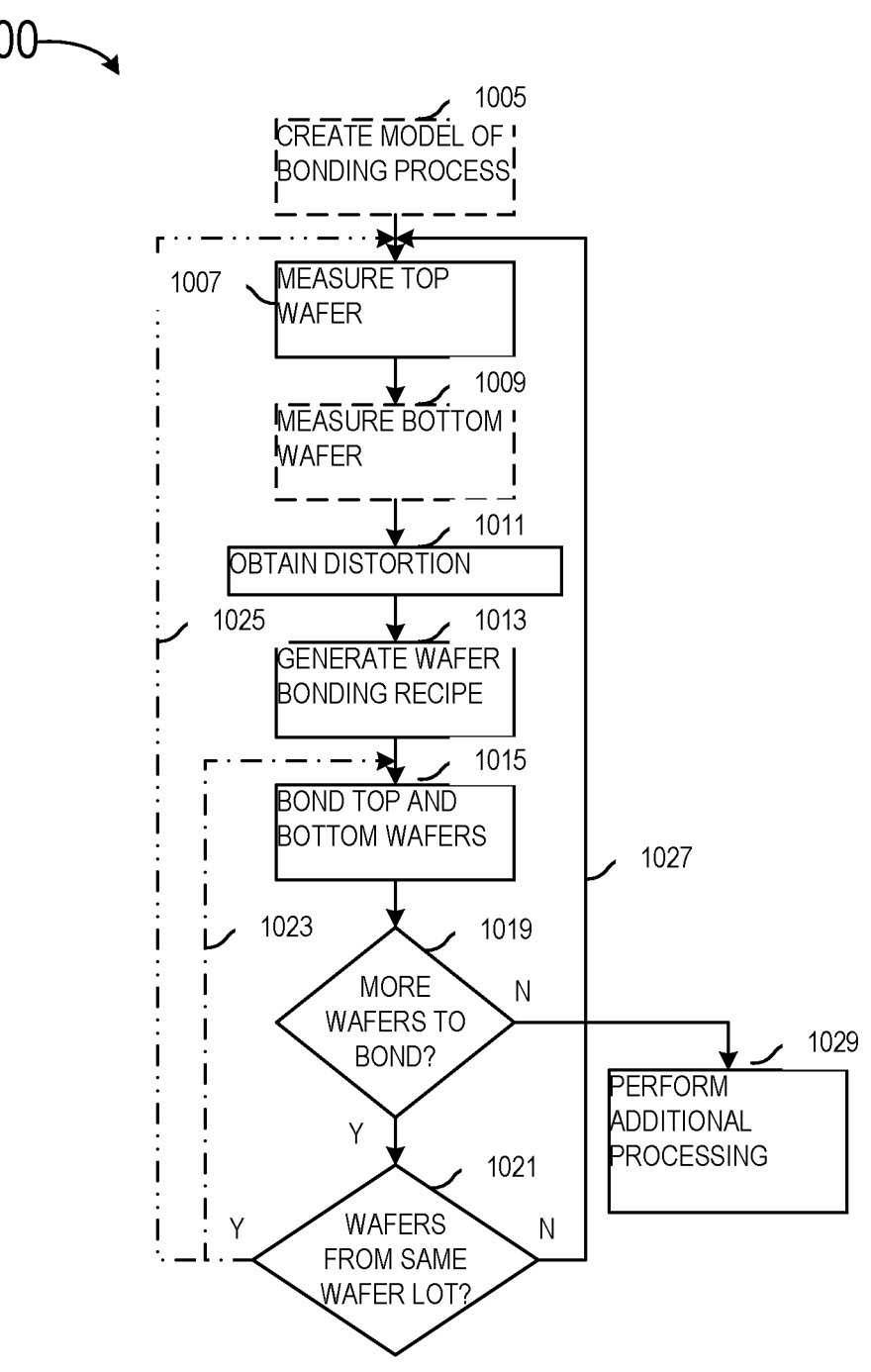
FIG. 10 illustrates a flow diagram of example operations occurring in a wafer bonding process with feedforward optimization of the wafer bonding recipe according to example embodiments presented herein.

FIG. 10 illustrates a flow diagram of example operations 1000 occurring in a wafer bonding process with feedforward optimization of the wafer bonding recipe according to example embodiments presented herein. The operations 1000 may be indicative of operations occurring in a wafer bonding system, e.g., the wafer bonding system 400, as a wafer processing tool in the wafer bonding system 400, e.g., the wafer processing tool 350, bonds wafers using a wafer bonding process with feedforward optimization of the wafer bonding recipe. The operations 1000 may be descriptive of the wafer fusion bonding processes 800 and 900.

The operations 1000 begin with the creating of a model of the wafer bonding process (block 1005). The model of the wafer bonding process is a mathematical model of the wafer bonding process that takes into account physical parameters of the pre-bond wafers, as well as the process conditions of the wafer bonding process and relates them to simulated distortion of the post-bond wafers. The model of the wafer bonding process may utilize any combination of finite element analysis, linear regression, random forest algorithm, genetic programming algorithm, patterned search algorithm, neural network algorithm, deep learning algorithm, and so on, to relate the simulated distortion of the post-bond wafers to the physical parameters of the pre-bond wafers and the process conditions of the wafer bonding process. In an embodiment, the model is created a priori by a wafer processing tool and stored in a memory. In an embodiment, the model is created by a tool not directly involved in the bonding of wafers and then provided to the wafer processing tool. A detailed discussion of several approaches that may be used to create the model is provided below.

The process conditions of the wafer bonding process may include pre-clean time, pre-clean solution chemical composition, temperature of the top wafer chuck, temperature of the bottom wafer chuck, plasma pre-treatment time, plasma pre-treatment power, wafer idle time, bonding time, bond initiation force, chamber atmospheric pressure, chamber mean temperature, chamber humidity, chamber atmospheric gas composition, bottom wafer chuck vacuum pressures, bottom wafer chuck vacuum zones, bottom wafer chuck vacuum on/off time, top wafer chuck vacuum pressures, top wafer chuck vacuum zones, top wafer chuck vacuum on/off time, top wafer chuck height variation, bottom wafer chuck height variation, bonding gap, pre-chuck wafer temperature, chuck height, etc. The model of the wafer bonding process may consider any or all of the process conditions listed above.

A metrology tool in the wafer bonding system 400, e.g., the metrology tool 360, can measure an incoming top wafer (block 1007). The metrology tool 360 may measure the top wafer and provides physical parameters (such as wafer shape data) of the top wafer. The metrology tool 360 can optionally measure an incoming bottom wafer (block 1009). The measuring of the incoming bottom wafer may follow a process similar to the measuring of the top wafer described above. In a situation where the incoming bottom wafer is a carrier wafer (i.e., the bottom wafer is unpatterned), the impact of the physical parameters of the bottom wafer on the distortion of the post-bond wafer may be insignificant compared to the impact of the patterned wafer (e.g., the incoming top wafer). Hence, it may be unnecessary to measure the bottom wafer. However, if both the top and bottom wafers are patterned, then the incoming bottom wafer should also be measured. The distortions of the incoming wafers are also obtained from the measurements of the incoming wafers (block 1011). The distortions of the wafers may be obtained using the same technique used during the creation of the model of the wafer bonding process, for example. Fingerprint coefficients may also be obtained for the wafers, using the same technique described in detail below for creating the model of the wafer bonding process, for example.

The wafer bonding recipe for bonding the incoming top wafer and the incoming bottom wafer is generated (block 1013). The wafer bonding recipe can be generated in accordance with the physical parameters of the incoming top wafer and the incoming bottom wafer (optional) and a post-bond distortion threshold for the post-bond wafer. The wafer bonding recipe can be generated using the model of the wafer bonding process, as created in block 1005, for example. In an embodiment, the wafer bonding recipe is generated by a tool controller in the wafer bonding system 400, e.g., the tool controller 370, by optimizing the wafer bonding recipe based on the physical parameters of the incoming top wafer and the incoming bottom wafer (optional), and the process conditions of an initial wafer bonding recipe (e.g., the POR wafer bonding recipe for the wafer bonding process). As an example, the wafer bonding recipe can be optimized by tuning the process conditions until the estimated post-bond distortion is reduced to the point where the estimated post-bond distortion is less than a post-bond distortion threshold. The optimization algorithm may be a linear programming algorithm, a genetic algorithm, random forest algorithm, a regression algorithm, or other techniques.

The optimized wafer bonding recipe comprising the optimized process conditions are the instructions for the wafer processing tool to perform the wafer bonding process for the incoming pre-bond wafer pair. The optimized process conditions may include pre-clean time, pre-clean solution chemical composition, temperature of the top wafer chuck, temperature of the bottom wafer chuck, plasma pre-treatment time, plasma pre-treatment power, wafer idle time, bonding time, bond initiation force, chamber atmospheric pressure, chamber mean temperature, chamber humidity, chamber atmospheric gas composition, bottom wafer chuck vacuum pressures, bottom wafer chuck vacuum zones, bottom wafer chuck vacuum on/off time, top wafer chuck vacuum pressures, top wafer chuck vacuum zones, top wafer chuck vacuum on/off time, top wafer chuck height variation, bottom wafer chuck height variation, bonding gap, pre-chuck wafer temperature, chuck height, etc.

In an embodiment, the model of the wafer bonding process, with the physical parameters of the incoming top wafer and the incoming bottom wafer (optional) and an initial wafer bonding recipe (e.g., the POR wafer bonding recipe), is used to estimate the post-bond distortion of the post-bond wafer. If the estimated post-bond distortion meets the post-bond distortion threshold, the initial wafer bonding recipe is selected as the wafer bonding recipe for bonding the incoming top wafer and the incoming bonding wafer. If the estimated post-bond distortion does not meet the post-bond distortion threshold, the wafer processing tool changes one or more process conditions of the wafer bonding recipe and re-estimates the post-bond distortion. In an iterative process, a wafer processing tool may continue to change process conditions until the estimated post-bond distortion meets the post-bond distortion threshold (or until a specified number of iterations is met, for example).

In an embodiment, a first wafer bonding recipe that results in an estimated post-bond distortion meeting the post-bond distortion threshold is the wafer bonding recipe used to bond the incoming wafers. In an embodiment, in a situation where a plurality of wafer bonding recipes result in estimated post-bond distortions that meet the post-bond distortion threshold, then the wafer bonding recipe out of the plurality of wafer bonding recipes with a smallest number of process condition changes (or a smallest amount of change to the process conditions, a process condition change easiest to implement, etc.) is the wafer bonding recipe used to bond the incoming wafers. As an example, if the estimated post-bond distortion for two wafer bonding recipes are about equal, then the wafer bonding recipe with changes to the process conditions that are the easiest to implement (e.g., smallest number of changes, smallest amount of changes, changes to more readily changeable process conditions, and so on) is the wafer bonding recipe used to bond the incoming wafers.

The wafer processing tool 350 bonds the incoming top wafer and the incoming bottom wafer (block 1015). The wafer processing tool 350 bonds the incoming wafers using the wafer bonding recipe generated in block 1013, for example.

A check is performed to determine if there are more wafers to bond (block 1019). If there are additional wafers to bond, then another check is performed to determine if the additional wafers are from the same wafer lot as the wafers previously bonded (block 1021). The same lot comparison may be performed by comparing the wafer lot associated with the wafer bonding recipe generated in block 1013 with the wafer lot of an incoming wafer pair, for example. This check may be useful in determining if the wafer bonding recipe should be re-optimized. As discussed previously, intra-lot variation is significantly smaller than inter-lot variation. If the additional wafers are from the same wafer lot, then it may not be necessary to re-optimize the wafer bonding recipe. If there are no additional wafers to bond, the wafer processing tool 350 may stop the wafer bonding process and potentially perform additional processing on the post-bond wafers (block 1029). Additional processing of the post-bond wafers may include annealing the post-bond wafers, which involves holding the post-bond wafers at an elevated temperature for a specified amount of time to strengthen the bond between the wafers of the post-bond wafers.

If the additional wafers are from the same wafer lot, then the same wafer bonding recipe generated in block 1013 may be used to bond the additional wafers. The wafer processing tool 350 returns to block 1015 to bond another pair of incoming wafers (shown as dot-dashed line 1023). The wafer processing tool 350 uses the same wafer bonding recipe to bond this pair of incoming wafers. The operations illustrated when the wafer processing tool 350 returns to block 1015 to bond another pair of incoming wafers without making measurements of the pair of incoming wafers or potentially updating the wafer bonding recipe is an example of the wafer fusion bonding process illustrated in FIG. 8.

Although re-optimization of the wafer bonding recipe may not be required for same lot wafers, it is still possible to re-optimize the wafer bonding recipe for each incoming wafer pair. In such a situation, the operations 1000 return to block 1007, where the metrology tool 360 measures the incoming wafers to obtain distortions, the tool controller 370 generates another wafer bonding recipe, and the wafer processing tool 350 bonds the incoming wafers (shown as double-dot-dashed line 1025). The operations 1000 illustrate when the wafer processing tool 350 returns to block 1007 to bond another pair of incoming wafers with making measurements of the pair of incoming wafers and potentially updating the wafer bonding recipe is an example of the wafer fusion bonding process illustrated in FIG. 9. As one practical implementation, the wafer measurements may be performed for each wafer pair before the wafers enters the wafer processing tool 350, for example, when or before undergoing prior steps. This may provide additional time for generating the optimized process recipe. In such cases, the model may include corrections to offset additional distortions to be introduced by the to be performed processing steps.

If the additional wafers are not from the same wafer lot, then the same wafer bonding recipe generated in block 1013 may not be able to bond wafers with post-bond distortions that meet the post-bond distortion threshold. The wafer bonding recipe should be regenerated with the physical parameters of the additional wafers. The operations 1000 return to block 1007, where the metrology tool 360 measures the incoming wafers to obtain distortions, the tool controller 370 generates another wafer bonding recipe, and the wafer processing tool 350 bonds the incoming wafers (shown as solid line 1027).

In an embodiment, measurements of the post-bond wafers that are bonded utilizing the optimized wafer bonding recipe are used to refine the model of the wafer bonding process to help improve the estimation accuracy of the model. The refinement of the model may follow the techniques illustrated in FIG. 12 or FIG. 13 or some other technique.

Figure 11A:
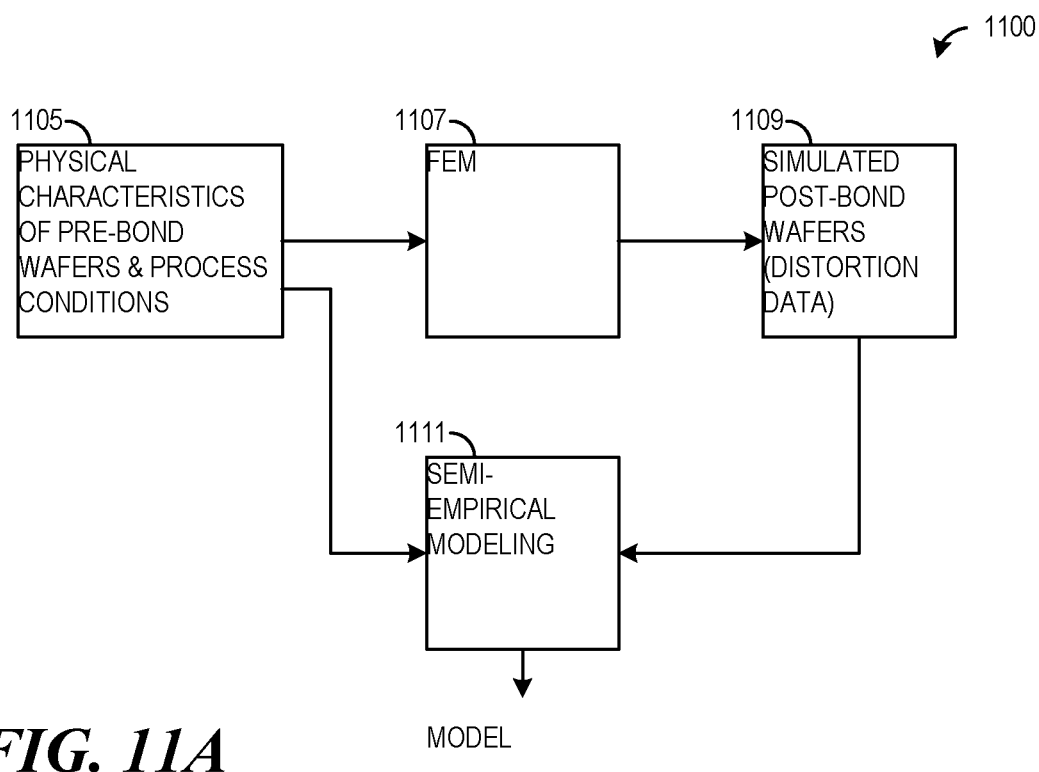
FIG. 11A illustrates a flow diagram of first example process creating a model of a wafer bonding process using a finite element modeling (FEM) technique enhanced with semi-empirical modeling according to example embodiments presented herein.

FIG. 11A illustrates a flow diagram of a first example process 1100 in creating a model of a wafer bonding process using a finite element modeling (FEM) technique enhanced with semi-empirical modeling according to example embodiments presented herein. The process 1100 may be indicative of operations occurring in a tool, such as a wafer processing tool or a tool dedicated to model creation, as the tool creates the model of the wafer bonding process using FEM techniques enhanced with semi-empirical modeling. In an embodiment, the FEM techniques are used to simulate the wafer bonding process over a wide range of incoming wafer physical characteristics and wafer bonding recipe process conditions. For example, wafers with different shape profiles may be simulated to obtain certain patterns and/or behavior that can then be represented in the model of the wafer bonding process. The FEM simulation typically solves a stress-strain equation using a 2-D (two dimensional) or 3-D (three dimensional) representation of the wafer using a finite element analysis technique. As one practical implementation, the wafer measurements may be performed for each wafer pair before the wafers enter the wafer processing tool, for example, when or before undergoing prior steps. This may provide additional time for generating the optimized process recipe. In such cases, the model may include corrections to offset additional distortions to be introduced by the to be performed processing steps. In addition, the FEM simulation in parallel may also simulate other physical processes that change the stress-strain of the system during the wafer bonding process. Some examples include reactions within the wafer, reflow of materials that change the stress, outgassing from different material layers within the wafer, and so forth.

In an embodiment, semi-empirical modeling is utilized to create and refine a model using data generated using the FEM techniques. The process 1100 may be an example implementation of block 1005 of FIG. 10.

The process 1100 begins with physical characteristics of pre-bond wafers and process conditions of a wafer bonding recipe (block 1105). The physical characteristics of the pre-bond wafers and the process conditions of the wafer bonding recipe may be inputs to a simulation of the wafer bonding process. The input is provided to a FEM simulation of the physics involved in the wafer bonding process (block 1107). The FEM simulation produces simulated post-bond wafers based on the input (i.e., the physical characteristics of the pre-bond wafers and the process conditions of the wafer bonding recipe such as applied pressure and temperature, etc.). The FEM simulation produces simulated post-bond wafers (block 1107). The simulated distortion data of the simulated post-bond wafers may be determined.

FEM simulation is able to simulate the output (i.e., the distortion data of the post-bond wafers) from the input (i.e., the physical characteristics of the pre-bond wafers and the process conditions of the wafer bonding recipe such as applied pressure and temperature) using the physics involved in wafer bonding, FEM simulation may be computationally intensive. Therefore, while FEM simulation may be directly used in actual wafer bonding deployments, certain embodiments may use a semi-empirical model. In an embodiment, semi-empirical modeling is used to help reduce the computational requirements associated with the creation of the model of the wafer bonding process.

The input and the output may be provided to a semi-empirical modeling process (block 1111). The inputs may be for wide range of pre-bond wafers and wafer lots, as well as a range of process conditions or wafer bonding recipes, while the outputs comprise simulated distortion data of simulated post-bond wafers bonded in accordance with the inputs. The semi-empirical modeling process is used to determine relationships between the inputs and the outputs. In other words, the semi-empirical modeling process utilizes empirical data (the inputs and the outputs) to develop a model of the wafer bonding process. The semi-empirical modeling process outputs the model of the wafer bonding process. The semi-empirical modeling process may use any of a variety of techniques, such as optimization techniques, searching techniques, annealing techniques, machine learning techniques (including but not limited to neural network techniques, deep learning techniques, regression techniques, classification techniques, clustering techniques, dimensionality reduction techniques, ensemble methods, transfer learning techniques, reinforcement learning techniques, and so on), etc.

In an embodiment, actual data (e.g., actual physical characteristics of pre-bond wafers, process conditions of wafer bonding recipes, and actual distortion of post-bond wafers bonded using the wafer bonding recipes) is also provided to the semi-empirical modeling process to help further refine the model of the wafer bonding process.

Figure 11B:
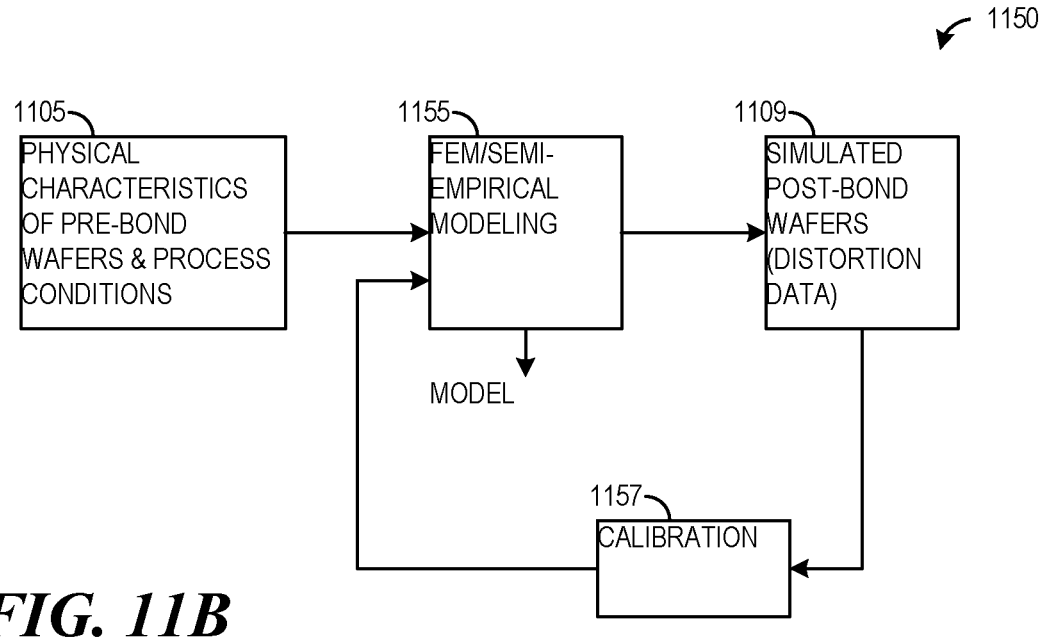
FIG. 11B illustrates a flow diagram of second example process in creating a model of a wafer bonding process using FEM techniques enhanced with semi-empirical modeling and calibration according to example embodiments presented herein.

FIG. 11B illustrates a flow diagram of second example process 1150 in creating a model of a wafer bonding process using FEM techniques enhanced with semi-empirical modeling and calibration according to example embodiments presented herein. Calibration may help to refine the model to account for parameters that may be difficult to account in a FEM simulation, for example, a pre-clean time or time over which the wafer is held together in block 1015 prior to annealing or the anneal time. In addition, many of the process knobs may be modeled similarly, e.g., top wafer chuck position and bottom wafer chuck position may be independently controlled but may be modelled similarly as a physical model only uses the relative distances. Therefore, a calibration may be necessary to tie the various process conditions with the model.

Further, while the calibration is described below with respect to the semi-empirical modeling, a similar approach may be used if the FEM simulation is directly used without the semi-empirical model.

The process 1150 may be indicative of operations occurring in a tool, such as a wafer processing tool or a tool dedicated to model creation, as the tool creates the model of the wafer bonding process using FEM techniques enhanced with semi-empirical modeling. In addition, calibration may be used to determine the contribution and impact of different process parameters on the model of the wafer bonding process. The process 1150 may be an example implementation of block 1005 of FIG. 10.

As shown in FIG. 11B, a model of the wafer bonding process is created using FEM techniques enhanced with semi-empirical modeling (block 1155). The model may be created based on physical characteristics of pre-bond wafers and process conditions of wafer bonding recipes. The process 1100 of FIG. 11A may be an example of block 1155.

After the model has been created, or as the model is being created, calibration may be performed (block 1157). Calibration may involve setting one or more process conditions of the wafer bonding recipe to predetermined values and then simulating the outputs in accordance with the calibrated process conditions. Calibration may be used to determine the impact or contribution of individual process conditions on the distortion of the post-bond wafer. As an example, one process condition is changed with the remainder of the process conditions held constant, and the resulting post-bond wafer is simulated using the process conditions. The model of the wafer bonding process may be refined in accordance with the simulated results.

Figure 12:
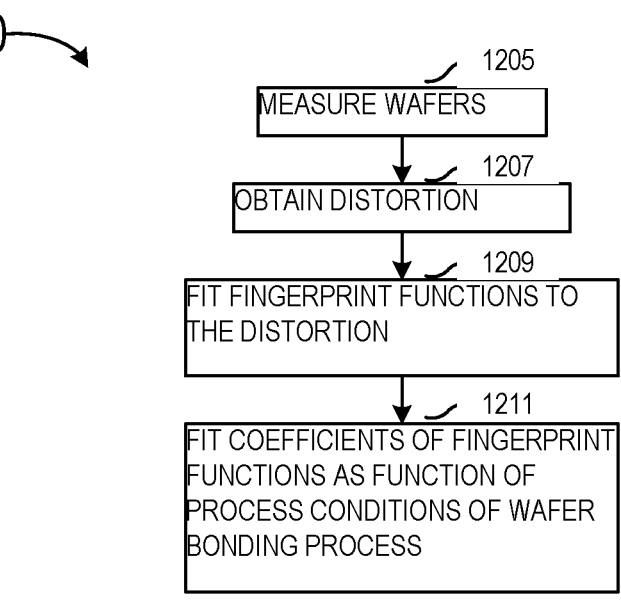
FIG. 12 illustrates a flow diagram of example operations occurring in creating a model of a wafer bonding process using fingerprinting functions according to example embodiments presented herein.

FIG. 12 illustrates a flow diagram of example operations 1200 occurring in creating a model of a wafer bonding process using fingerprinting functions according to example embodiments presented herein. The operations 1200 may be indicative of operations occurring in a tool, such as a wafer processing tool or a tool dedicated to model creation, as the tool creates the model of the wafer bonding process using fingerprinting functions. The operations 1200 may be an example implementation of block 1005 of FIG. 10.

The operations 1200 begin with the measuring of wafer to obtain physical parameters (block 1205). The wafers measured include pre-bond wafers (i.e., the top wafers and the bottom wafers). The wafers may be measured using a metrology tool (such as a surface profilometer, a scanner, and so on). In a situation where both the top and bottom wafers are patterned, both wafers should be measured. In a situation where only one wafer is patterned, it may not be necessary to measure the unpatterned wafer. Measurements are made for a plurality of pre-bond wafers. As an example, top and bottom wafers from different lots are measured. Distortions are obtained from the measurements of the wafers (block 1207). The distortions may be derived from the measurements of the wafers through geometric calculations, for example.

Fingerprinting functions are fitted to the distortions (block 1209). In general, fingerprinting functions are mathematical models of a respective metric that retains spatial information of the measurements. The fitting of the fingerprinting functions to the distortions may involve an analysis (such as a regression analysis) to select and adjust the parameters of the fingerprinting functions to fit the distortions within a specified threshold. As an example, the distortions may be expressed mathematically as a finite series of fingerprinting functions, such as polynomials (e.g., Zernike polynomials) or functions (such as, Fourier series or Bessel function). Each polynomial or function is weighed by a respective coefficient that are the fitting parameters that may be adjusted to fit the distortions. The fitted coefficients represent unique tendencies of the distortion for a particular wafer. In an embodiment, the fingerprinting functions are fitted to the distortions of the wafers (e.g., the pre-bond wafers and the post-bond wafers).

The fitted coefficients of the fingerprinting functions are fitted as function of process conditions of the wafer bonding process (block 1211). The model of the wafer bonding process may be created by fitting the fitted coefficients of the fingerprinting functions as a function of the process conditions of the wafer bonding process used to bond the wafers, as well as the distortion of the pre-bond wafers (which are also converted into fingerprinting coefficients). The function may be linear, quadratic, exponential, or other nonlinear forms, with one or more of the process conditions discussed previously. The function may also include terms where two or more of the process conditions interact with each other in linear, quadratic, exponential, or other nonlinear form, ways. The exact format of the function may be determined through a computer algorithm, for example linear regression, random forest, genetic programming, pattern search, neural network, deep learning, etc. The model is constructed so that the post-bond wafer distortion can be estimated by using any process conditions that is within the limits of the database, and the pre-bond wafer physical parameters. The ability of the model of the wafer bonding process to estimate the distortion of the post-bond wafer in accordance with the process conditions of the wafer bonding process and the characteristics of the pre-bond wafers enables the optimization of the wafer bonding recipe before the bonding of the pre-bond wafer pair. A detailed description of fingerprinting functions and examples of their use is provided in co-assigned U.S. patent application Ser. No. 16/666,087, entitled "Systems and Methods for Manufacturing Microelectronic Devices," filed Oct. 28, 2019, which is hereby incorporated by reference in its entirety.

Figure 13:
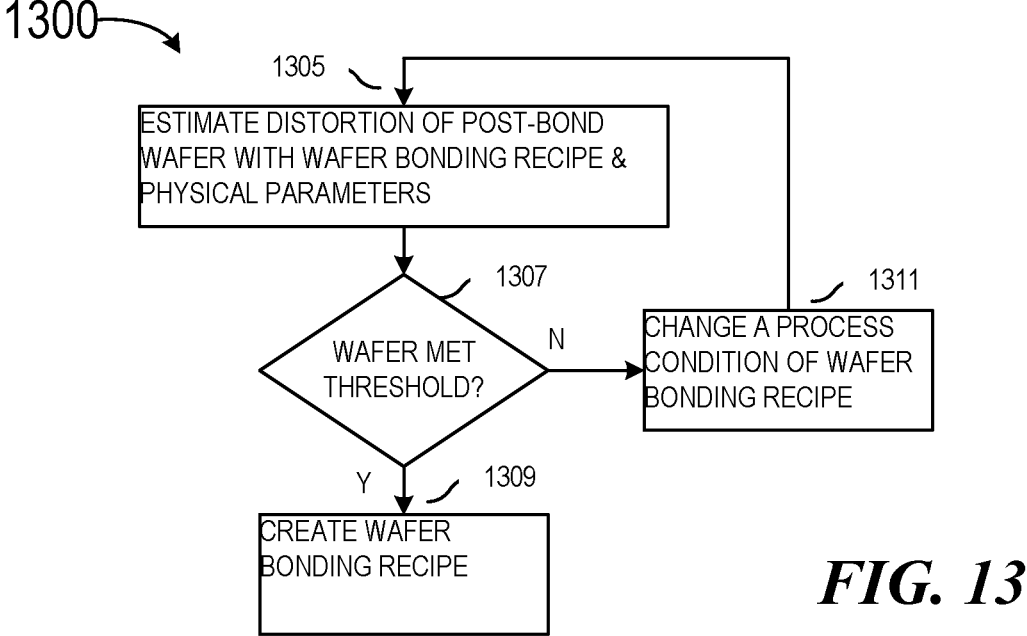
FIG. 13 illustrates a flow diagram of operations occurring in a generation of a wafer bonding recipe with feedforward based optimization of the wafer bonding recipe according to example embodiments presented herein.

FIG. 13 illustrates a flow diagram of operations 1300 occurring in a generation of a wafer bonding recipe with feedforward based optimization of the wafer bonding recipe according to example embodiments presented herein. The operations 1300 may be indicative of operations occurring in a wafer processing tool as the wafer processing tool generates a wafer bonding recipe with feedforward based optimization of the wafer bonding recipe. The operations 1300 may be an example implementation of block 1013 of FIG. 10.

The operations 1300 begin with the model in block 1005 of the wafer processing tool estimating the post-bond distortion of a post-bond wafer that is bonded using an initial wafer bonding recipe (block 1305). The post-bond distortion of the post-bond wafer is estimated using the physical parameters of the incoming wafers and the process conditions for the initial wafer bonding recipe (e.g., the POR wafer bonding recipe) as described in blocks 1007, 1009 and 1011 of FIG. 10.

A check is performed to determine if the estimated post-bond distortion of the post-bond wafer meets the post-bond distortion threshold (block 1307). If the estimated post-bond distortion meets the post-bond distortion threshold, then the wafer processing tool creates the wafer bonding recipe (block 1309). The wafer bonding recipe is created from the process condition of wafer bonding recipe used in the estimation of block 1305. The wafer bonding recipe includes any changes to the process conditions of the initial wafer bonding recipe.

If the estimated post-bond distortion of the post-bond wafer does not meet the post-bond distortion threshold, a change is made to one or more process conditions of the wafer bonding recipe (block 1311). A selection of the one or more process conditions may be based on factors such as how far the estimated post-bond distortion is away from meeting the post-bond distortion threshold, impact of a process condition on the post-bond distortion, ease of changing a process condition, and so forth. As an example, if the estimated post-bond distortion is close to meeting the post-bond distortion threshold, the one or more process conditions changed may be process conditions that are easy to change and have been shown to have change the estimated post-bond distortion in a fine grained manner, while if the estimated post-bond distortion is far from meeting the post-bond distortion threshold, the one or more process conditions changed may process conditions that have been shown to have coarse grained changes to the estimated post-bond distortion (to potentially reduce a number of times the wafer bonding recipe is changed before the estimated post-bond distortion meets the post-bond distortion threshold, for example). As another example, some process conditions are easier to change. For example, wafer chuck temperature may be easier to change than pre-clean solution chemical composition. Therefore, such process conditions are more feasible candidates for changing.

Example changes to the wafer bonding recipe may include changes to any one or more of the following process conditions: pre-clean time, pre-clean solution chemical composition, temperature of the top wafer chuck, temperature of the bottom wafer chuck, plasma pre-treatment time, plasma pre-treatment power, wafer idle time, bonding time, bond initiation force, chamber atmospheric pressure, chamber mean temperature, chamber humidity, chamber atmospheric gas composition, bottom wafer chuck vacuum pressures, bottom wafer chuck vacuum zones, bottom wafer chuck vacuum on/off time, top wafer chuck vacuum pressures, top wafer chuck vacuum zones, top wafer chuck vacuum on/off time, top wafer chuck height variation, bottom wafer chuck height variation, bonding gap, pre-chuck wafer temperature, chuck height, and so forth. The wafer processing tool returns to block 1305 to re-estimate the post-bond distortion of the post-bond wafer bonded in accordance with the changed wafer bonding recipe.

Figure 14:
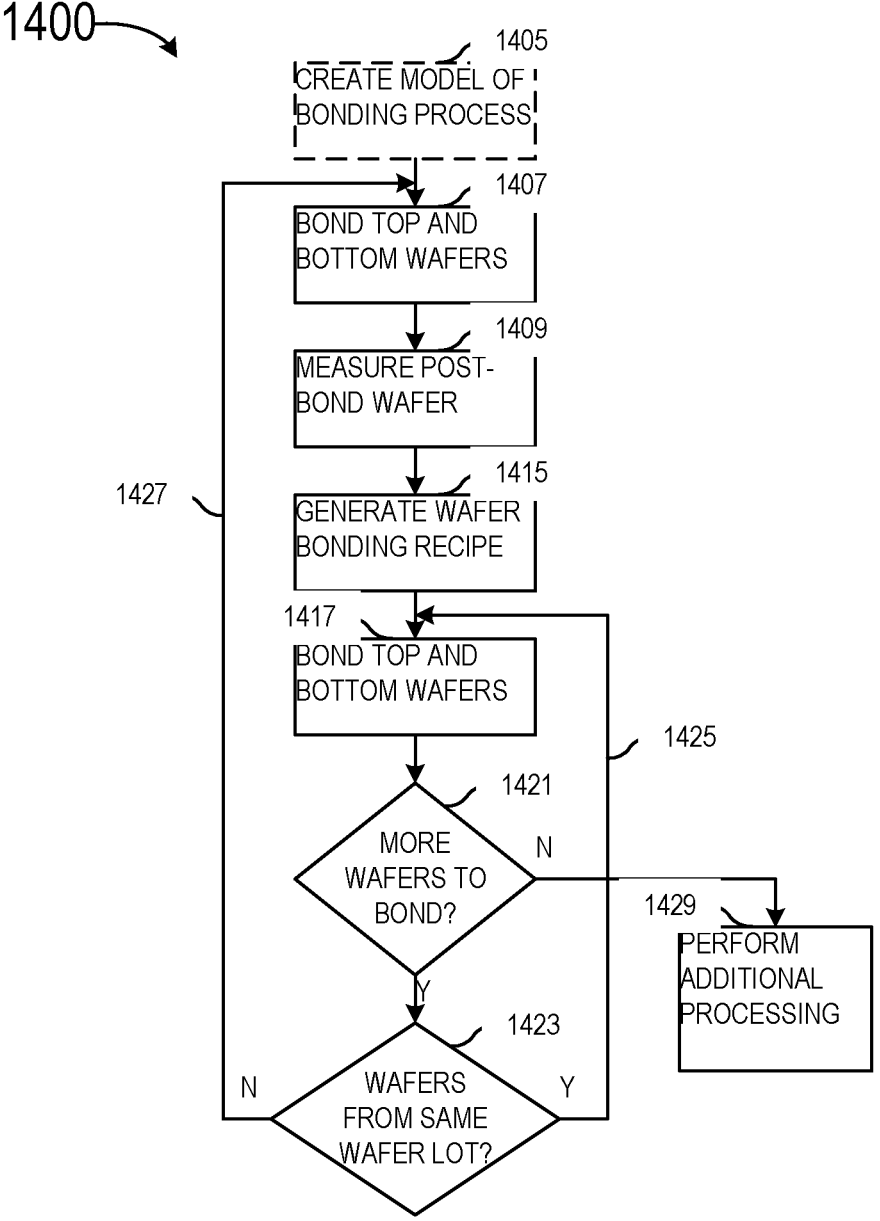
FIG. 14 illustrates a flow diagram of example operations occurring in a wafer bonding process with feedback optimization of the wafer boding recipe according to example embodiments presented herein.

FIG. 14 illustrates a flow diagram of example operations 1400 occurring in a wafer bonding process with feedback optimization of the wafer bonding recipe according to example embodiments presented herein. The operations 1400 may be indicative of operations occurring in a wafer processing tool as the wafer processing tool bonds wafers using a wafer bonding process with feedback optimization of the wafer bonding recipe. The operations 1400 may be descriptive of wafer fusion bonding process 700.

The operations 1400 begin with the creating of a model of the wafer bonding process (block 1405). The model of the wafer bonding process may be created based on measurements of post-bond wafers and process conditions of the wafer bonding recipes. The model of the wafer bonding process may utilize any combination of finite element analysis, linear regression, random forest algorithm, genetic programming algorithm, patterned search algorithm, neural network algorithm, deep learning algorithm, and so on, to relate the distortion of the post-bond wafers to the process conditions of the wafer bonding recipes. In an embodiment, the model is created a priori by a wafer processing tool and stored in a memory. In an embodiment, the model is created by a tool not directly involved in the bonding of wafers and then provided to the wafer processing tool. A detailed discussion of an example approach that may be used to create the model is provided below.

The wafer processing tool bonds the incoming top wafer and the incoming bottom wafer (block 1407). In an embodiment, the wafer processing tool bonds the incoming top and bottom wafers using a POR wafer bonding recipe, for example. In another embodiment, the wafer processing tool bonds the incoming top and bottom wafers using a most recent wafer bonding recipe used for bonding wafers of the same design. The wafers being bonded may be from the same lot or from different lots of wafers bonded using the most recent wafer bonding recipe. The wafer processing tool measures the post-bond wafer (block 1409). As an example, distortions of the post-bond wafer are measured. The measurement of the post-bond wafer may be performed using a metrology tool, such as a scanner.

The wafer bonding recipe is generated (block 1415). The wafer bonding recipe is generated in accordance with the measurements (e.g., distortions) of the post-bond wafer. The wafer bonding recipe is generated using the model of the wafer bonding process, as created in block 1405, for example. In an embodiment, the wafer bonding recipe is generated by optimizing the wafer bonding recipe based on the distortions of the post-bond wafer, and the process conditions of an initial wafer bonding recipe (e.g., the POR wafer bonding recipe for the wafer bonding process). As an example, the wafer bonding recipe is optimized by tuning the process conditions until the estimated post-bond distortion is reduced to the point where the estimated post-bond distortion is less than a post-bond distortion threshold. The optimization algorithm may be a linear programming algorithm, a genetic algorithm, random forest algorithm, a regression algorithm, or other techniques.

The wafer processing tool bonds an incoming wafer pair (block 1417). The incoming wafer pair is bonded in accordance with the wafer bonding recipe generated in block 1415.

A check is performed to determine if there are more wafers to bond (block 1421). If there are additional wafers to bond, then another check is performed to determine if the additional wafers are from the same wafer lot as the wafers previously bonded (block 1423). The same lot comparison may be performed by comparing the wafer lot associated with the wafer bonding recipe generated in block 1415 with the wafer lot of an incoming wafer pair, for example. This check may be useful in determining if the wafer bonding recipe should be re-optimized. As discussed previously, intra-lot variation is significantly smaller than inter-lot variation.

If the additional wafers are from the same wafer lot, then it may not be necessary to re-optimize the wafer bonding recipe. In such a situation, the wafer processing tool returns to block 1417 to bond an incoming wafer pair (shown as line 1425). In an embodiment, even if the additional wafers are from the same wafer lot, the wafer bonding recipe may still be re-optimized. In this situation, the wafer processing tool returns to block 1409 to make measurements of the post-bond wafer and uses the measurements to generate the wafer bonding recipe in block 1415. If there are no additional wafers to bond, the wafer processing tool may stop the wafer bonding process and potentially perform additional processing on the post-bond wafers (block 1429). Additional processing of the post-bond wafers may include annealing the post-bond wafers, which involves holding the post-bond wafers at an elevated temperature for a specified amount of time to strengthen the bond between the wafers of the post-bond wafers.

If the additional wafers are from a different wafer lot, the wafer processing tool returns to block 1407 (shown as line 1427) to bond an initial pair of wafers from the different wafer lot. The post-bond wafer comprising the initial pair of wafers from the different wafer lot may be used to generate a new wafer bonding recipe usable in bonding remaining wafers from the different wafer lot.

In an embodiment, measurements of the post-bond wafers that are bonded utilizing the optimized wafer bonding recipe are used to refine the model of the wafer bonding process to help improve the estimation accuracy of the model.

Figure 15:
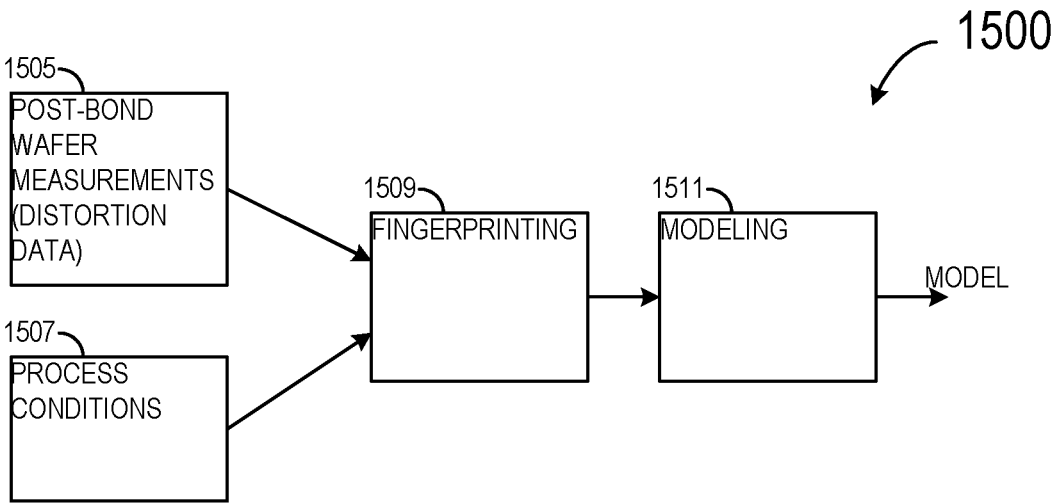
FIG. 15 illustrates a flow diagram of an example process in creating a model of a wafer bonding processing using feedback data according to example embodiments presented herein.

FIG. 15 illustrates a flow diagram of an example process 1500 in creating a model of a wafer bonding processing using feedback data according to example embodiments presented herein. The process 1500 may be indicative of operations occurring in a tool, such as a wafer processing tool or a tool dedicated to model creation, as the tool creates the model of the wafer bonding process using feedback data using feedback data. In an embodiment, fingerprinting functions are used in determining a relationship between distortion data of post-bond wafers and process conditions of wafer bonding recipes. The use of fingerprinting advantageously reduces the computational load to generate the optimized process recipe for each wafer. The process 1500 may be an example implementation of block 1405 of FIG. 14.

The process 1500 begins with inputs, such as measurements of post-bond wafers (block 1505) and process conditions of wafer bonding recipes (block 1507) being provided to a fingerprinting process (block 1509). The measurements, such as distortion measurements, of the post-bond wafers may be taken for post-bond wafers after they have been bonded (using a particular wafer bonding recipe) or after they have been annealed. The process conditions correspond to the wafer bonding recipes used to form the post-bond wafers. The fingerprinting process may include the fitting of fingerprinting functions to the distortion measurements. As discussed previously, fingerprinting functions are mathematical models of a respective metric that retains spatial information of the measurements. The fitted coefficients represent unique tendencies of the distortion for a particular post-bonded wafer. In an embodiment, the fingerprinting functions are fitted to the distortions of the post-bond wafers.

The fitted coefficients of the fingerprinting functions are provided to a modeling process to create the model of the wafer bonding process (block 1511). The fitted coefficients of the fingerprinting functions may be fitted as function of process conditions of the wafer bonding process. The model of the wafer bonding process may be created by fitting the fitted coefficients of the fingerprinting functions as a function of the process conditions of the wafer bonding process used to bond the wafers, as well as the distortion of the post-bond wafers. The function may be linear, quadratic, exponential, or other nonlinear forms, with one or more of the process conditions discussed previously. The function may also include terms where two or more of the process conditions interact with each other in linear, quadratic, exponential, or other nonlinear form, ways. The exact format of the function may be determined through a computer algorithm, for example linear regression, random forest, genetic programming, pattern search, neural network, deep learning, etc. The model is constructed so that the process conditions may be estimated by using any distortion of the post-bond wafers. The ability of the model of the wafer bonding process to estimate the process conditions in accordance with the distortion of the post-bond wafers enables the optimization of the wafer bonding recipe from the distortion measurements of the post-bond wafers.

Figure 16:
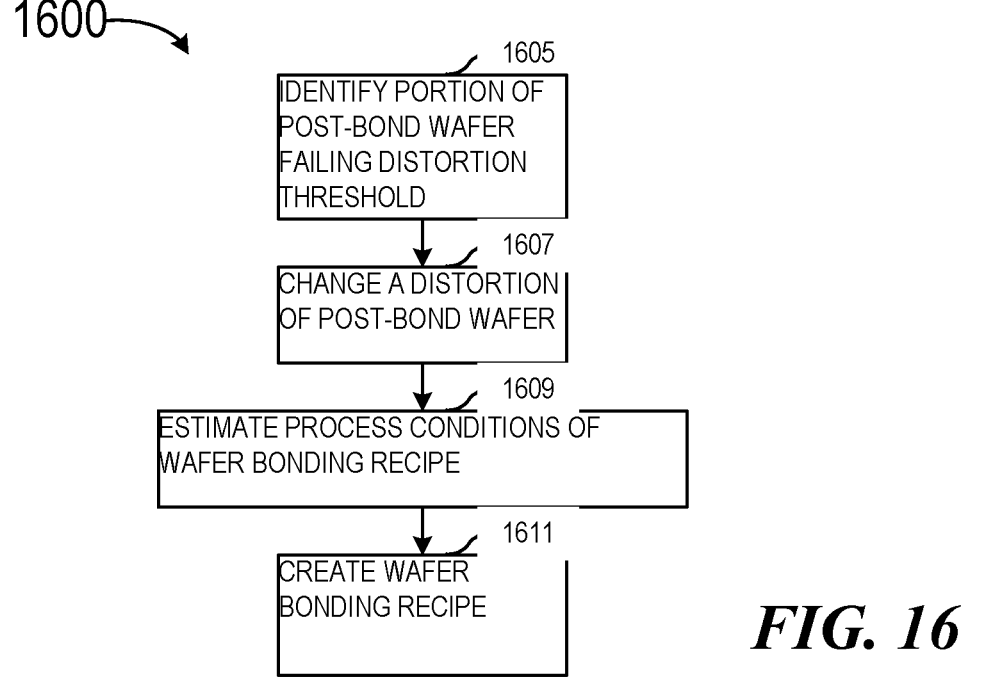
FIG. 16 illustrates a flow diagram of operations occurring in a generation of a wafer bonding recipe with feedback based optimization of the wafer bonding recipe according to example embodiments presented herein.

FIG. 16 illustrates a flow diagram of operations 1600 occurring in a generation of a wafer bonding recipe with feedback based optimization of the wafer bonding recipe according to example embodiments presented herein. The operations 1600 may be indicative of operations occurring in a wafer processing tool as the wafer processing tool generates a wafer bonding recipe with feedback based optimization of the wafer bonding recipe. The operations 1600 may be an implementation of block 1415 of FIG. 14.

The operations 1600 begin with the wafer processing tool identifying a portion of a post-bond wafer that fails to meet a post-bond wafer distortion threshold (block 1605). As an example, given a particular post-bond wafer, with distortion that fails to meet a post-bond wafer distortion threshold, the wafer processing tool determines one or more portions of the post-bond wafer with distortion measurements that fail to meet the post-bond wafer distortion threshold. In an embodiment, in a situation where there is a plurality of portions of the post-bond wafer that all fail the post-bond wafer distortion threshold, the wafer processing tool may identify a subset of the plurality, correct for that identified subset, and repeat for other subsets of the plurality until all of the plurality of portions of the post-bond wafer that all fail the post-bond wafer distortion threshold have been addressed.

The wafer processing tool makes a change to the distortion of the identified portion of the post-bond wafer (block 1607). In an embodiment, the wafer processing tool changes the distortion in only the identified portion of the post-bond wafer. In an embodiment, the wafer processing tool changes the distortion in not just the identified portion of the post-bond wafer, but in adjacent and, perhaps, nearby portions of the post-bond wafer, to make the change in the distortion continuous. The definition of "nearby portions" may be a configuration parameter for the wafer processing tool, potentially trading off optimization complexity for bonding performance.

The wafer processing tool estimates the process conditions of the wafer bonding recipe that would produce a post-bond wafer with the distortion measurements (block 1609). In other words, the wafer processing tool, using the model of the wafer bonding process, estimates the process conditions that would result in a post-bond wafer that would have a measured distortion that matches the changed distortion. The wafer processing tool creates the wafer bonding recipe from the estimated process conditions (block 1611).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A wafer bonding system, comprising:
a wafer bonding tool configured to bond a first wafer and a second wafer to each other in accordance with a first wafer bonding recipe to produce a first post-bond wafer;

a metrology tool integrated with the wafer bonding tool, the metrology tool configured to measure a physical parameter of the first wafer, the physical parameter of the first wafer representing information relating to topographical features of the first wafer; and a tool controller coupled to the wafer bonding tool and the metrology tool, the tool controller having a model of a wafer bonding process, the model including an input indicative of the physical parameter of the first wafer and configured to generate the first wafer bonding recipe based, at least in part, on the physical parameter of the first wafer, wherein the wafer bonding tool is further configured to bond a fifth wafer and a sixth wafer to each other in accordance with the first wafer bonding recipe to produce a third post-bond wafer, the physical parameter of the first wafer includes at least one of overlay, in-plane distortion (IPD), slope, curvature, force, and stress of the first wafer, and the metrology tool includes a dual Fizeau wafer interferometer, a Shack-Hartmann sensor, a PhotoStress analysis system, a wavefront phase sensor, a multi-beam reflectometry, or capacitance sensors.

2. The wafer bonding system of claim 1, wherein the tool controller is configured to derive the model of the wafer bonding process by:

having the metrology tool to measure a physical parameter of a third wafer and a physical parameter of a fourth wafer;

simulating wafer bonding of the third wafer and the fourth wafer in accordance with process conditions to estimate a physical parameter of a simulated post-bond wafer; and creating the model of the wafer bonding process in accordance with the physical parameter of the third wafer, the physical parameter of the fourth wafer, the process conditions, and the estimated physical parameter of the simulated post-bond wafer.

3. The wafer bonding system of claim 2, wherein the tool controller is configured to create the model of the wafer bonding process by:

comparing the physical parameter of the third wafer, the physical parameter of the fourth wafer, the process conditions, and the estimated physical parameter of the simulated post-bond wafer; and determining the model of the wafer bonding process in accordance with the comparison.

4. The wafer bonding system of claim 3, wherein the tool controller generates the first wafer bonding recipe by:

estimating, by the model, post-bond distortions of the first post-bond wafer in accordance with the physical parameter of the first wafer;

tuning process conditions of the first wafer bonding recipe to optimize the estimated post-bond distortions of the first post-bond wafer; and generating the first wafer bonding recipe in accordance with the tuned process conditions.

5. The wafer bonding system of claim 1, wherein the metrology tool is further configured to measure a physical parameter of the second wafer, the physical parameter of the second wafer representing information relating to topographical features of the second wafer, and the model generates the first wafer bonding recipe further based on the physical parameter of the second wafer.

6. The wafer bonding system of claim 1, wherein the first wafer and the third wafer are part of a first wafer lot, and the second wafer and the fourth wafer are part of a second wafer lot, and wherein the first wafer lot and the second wafer lot are processed together in a semiconductor fabrication process flow.

7. The wafer bonding system of claim 1, wherein the metrology tool is further configured to measure a physical parameter of the first post-bond wafer, the physical parameter of the first post-bond wafer representing information relating to topographical features of the first post-bond wafer, the model further includes an input indicative of the physical parameter of the first post-bond wafer and is configured to output a second wafer bonding recipe based on the physical parameter of the first post-bond wafer, and the wafer bonding tool is further configured to bond a third wafer and a fourth wafer to each other in accordance with the second wafer bonding recipe to produce a second post-bond wafer.

8. The wafer bonding system of claim 7, wherein the metrology tool is further configured to measure a physical parameter of the third wafer, the physical parameter of the third wafer representing information relating to topographical features of the third wafer, and the model further includes an input indicative of the physical parameter of the third wafer and is configured to output the second wafer bonding recipe further based on the physical parameter of the third wafer.

9. The wafer bonding system of claim 1, further comprising an enclosure, wherein the wafer bonding tool, the metrology tool and the tool controller are located within the enclosure.

10. The wafer bonding system of claim 1, wherein the physical parameter of the first wafer includes the IPD of the first wafer, the metrology tool includes the dual Fizeau wafer interferometer, and the dual Fizeau wafer interferometer is configured to measure the IPD of the first wafer and includes first and second cameras, first and second computers, first and second relay lens, first and second polarizing beam splitter (PBS), first and second N/4 waveplates, first and second collimators, first and second reference flats and a detector.

11. The wafer bonding system of claim 1, wherein the physical parameter of the first wafer includes the slope of the first wafer, the metrology tool includes the Shack-Hartmann sensor, and the Shack-Hartmann sensor is configured to measure the slope of the first wafer and includes a lenslet array where a wavefront enters and a camera on which a spot field is created.

12. The wafer bonding system of claim 1, wherein the physical parameter of the first wafer includes the slope of the first wafer, the metrology tool includes the wavefront phase sensor, and the wavefront phase sensor is configured to measure the slope of the first wafer.

13. The wafer bonding system of claim 1, wherein the physical parameter of the first wafer includes the curvature of the first wafer, the metrology tool includes the multi-beam reflectometry, and the multi-beam reflectometry is configured to measure the curvature of the first wafer and includes a camera and a lens assembly.

14. A wafer bonding system, comprising:

a wafer bonding tool configured to bond a first wafer and a second wafer to each other in accordance with a first wafer bonding recipe to produce a first post-bond wafer, and to bond a third wafer and a fourth wafer to each other in accordance with a second wafer bonding recipe to produce a second post-bond wafer;

a metrology tool integrated with the wafer bonding tool, the metrology tool configured to measure a physical parameter of the first post-bond wafer, the physical parameter of the first post-bond wafer representing information relating to topographical features of the first post-bond wafer; and a tool controller coupled to the wafer bonding tool and the metrology tool, the tool controller having a model of a wafer bonding process, the model including an input indicative of the physical parameter of the first post-bond wafer and configured to generate the second wafer bonding recipe based, at least in part, on the physical parameter of the first post-bond wafer, wherein the wafer bonding tool is further configured to bond a seventh wafer and an eighth wafer to each other in accordance with the second wafer bonding recipe to produce a fourth post-bond wafer, the physical parameter of the first wafer includes at least one of overlay, in-plane distortion (IPD), slope, curvature, force, and stress of the first wafer, and the metrology tool includes a dual Fizeau wafer interferometer, a Shack-Hartmann sensor, a PhotoStress analysis system, a wavefront phase sensor, a multi-beam reflectometry, or capacitance sensors.

15. The wafer bonding system of claim 14, wherein the metrology tool is further configured to measure a physical parameter of the second post-bond wafer, the physical parameter of the second post-bond wafer representing information relating to topographical features of the second post-bond wafer, the model further includes an input indicative of the physical parameter of the second post-bond wafer and configured to generate a third wafer bonding recipe in accordance with the physical parameter of the second post-bond wafer, and the wafer bonding tool is further configured to bond a fifth wafer and a sixth wafer to each other in accordance with the third wafer bonding recipe to produce a third post-bond wafer.

16. The wafer bonding system of claim 14, wherein the metrology tool is further configured to measure a physical parameter of the first wafer, the physical parameter of the first wafer representing information relating to topographical features of the first wafer, and the model further includes an input indicative of the physical parameter of the first wafer and is configured to generate the first wafer bonding recipe in accordance with the physical parameter of the first wafer.

17. The wafer bonding system of claim 16, wherein the metrology tool is further configured to measure a physical parameter of the second wafer, the physical parameter of the second wafer representing information relating to topographical features of the second wafer, and the model generates the first wafer bonding recipe further based on the physical parameter of the second wafer.

18. The wafer bonding system of claim 14, further comprising an enclosure, wherein the wafer bonding tool, the metrology tool and the tool controller are located within the enclosure.

19. The wafer bonding system of claim 14, wherein the physical parameter of the first wafer includes at least one of the overlay, the in-plane distortion, the slope, the curvature, the force and the stress of the first wafer.

20. The wafer bonding system of claim 14, wherein the metrology tool includes the dual Fizeau wafer interferometer, the Shack-Hartmann sensor, the PhotoStress analysis system, the wavefront phase sensor, the multi-beam reflectometry or the capacitance sensors.

* * * * *